United States Patent [19]
Anderson

[11] Patent Number: 5,654,204
[45] Date of Patent: Aug. 5, 1997

[54] DIE SORTER

[76] Inventor: James C. Anderson, 4 E. Myrna La., Tempe, Ariz. 85284

[21] Appl. No.: 277,860

[22] Filed: Jul. 20, 1994

[51] Int. Cl.$^6$ .................................................. H01L 21/00
[52] U.S. Cl. ........................ 438/15; 438/17; 438/460
[58] Field of Search ...................... 437/7, 8, 226, 437/924

[56] References Cited

U.S. PATENT DOCUMENTS

| | | | |
|---|---|---|---|
| 4,814,296 | 3/1989 | Jeducika et al. | 437/226 |
| 4,816,422 | 3/1989 | Yerman et al. | 437/924 |
| 4,967,229 | 10/1990 | Akutagawa | 437/226 |
| 5,105,255 | 4/1992 | Shannon et al. | 437/924 |
| 5,206,181 | 4/1993 | Gross | 437/226 |
| 5,314,844 | 5/1994 | Imamura | 437/226 |
| 5,326,428 | 7/1994 | Farnworth et al. | 437/8 |
| 5,360,747 | 11/1994 | Larson et al. | 437/8 |
| 5,369,060 | 11/1994 | Baumann et al. | 437/226 |
| 5,393,706 | 2/1995 | Mignardi et al. | 437/226 |
| 5,396,068 | 3/1995 | Bethea | 437/8 |

FOREIGN PATENT DOCUMENTS 63-232319  9/1988  Japan ..................................... 437/924

*Primary Examiner*—Kevin Picardat
*Attorney, Agent, or Firm*—Townsend and Townsend and Crew LLP

[57] ABSTRACT

An integrated circuit probing method and apparatus therefor. The apparatus includes a main system controller coupled to a network interface, graphic user interface, and equipment interface. A high speed bus connects the main system controller to a group of subsystems. The subsystems includes subsystems such as input cassettes, input frame handing, frame to align, die align, die probing, die bin and die output, output cassettes subsystem, among others. The integrated circuit probing apparatus allows for probing of each individual die through the die probing subsystem, typically a high speed subsystem.

29 Claims, 23 Drawing Sheets

Input Cassettes Subsystem

Input Cassettes Subsystem

Frames Handling Subsystem

Frames Handling Subsystem

*Frame to Align Subsystem*

*Die Alignment Subsystem*

Die Probing Subsystem

*Die Probing Subsystem*

Die Bin-ing and
Die Output Subsystem

Die Bin-ing and
Die Output Subsystem

Out Cassettes Subsystem

*Out Cassettes Subsystem*

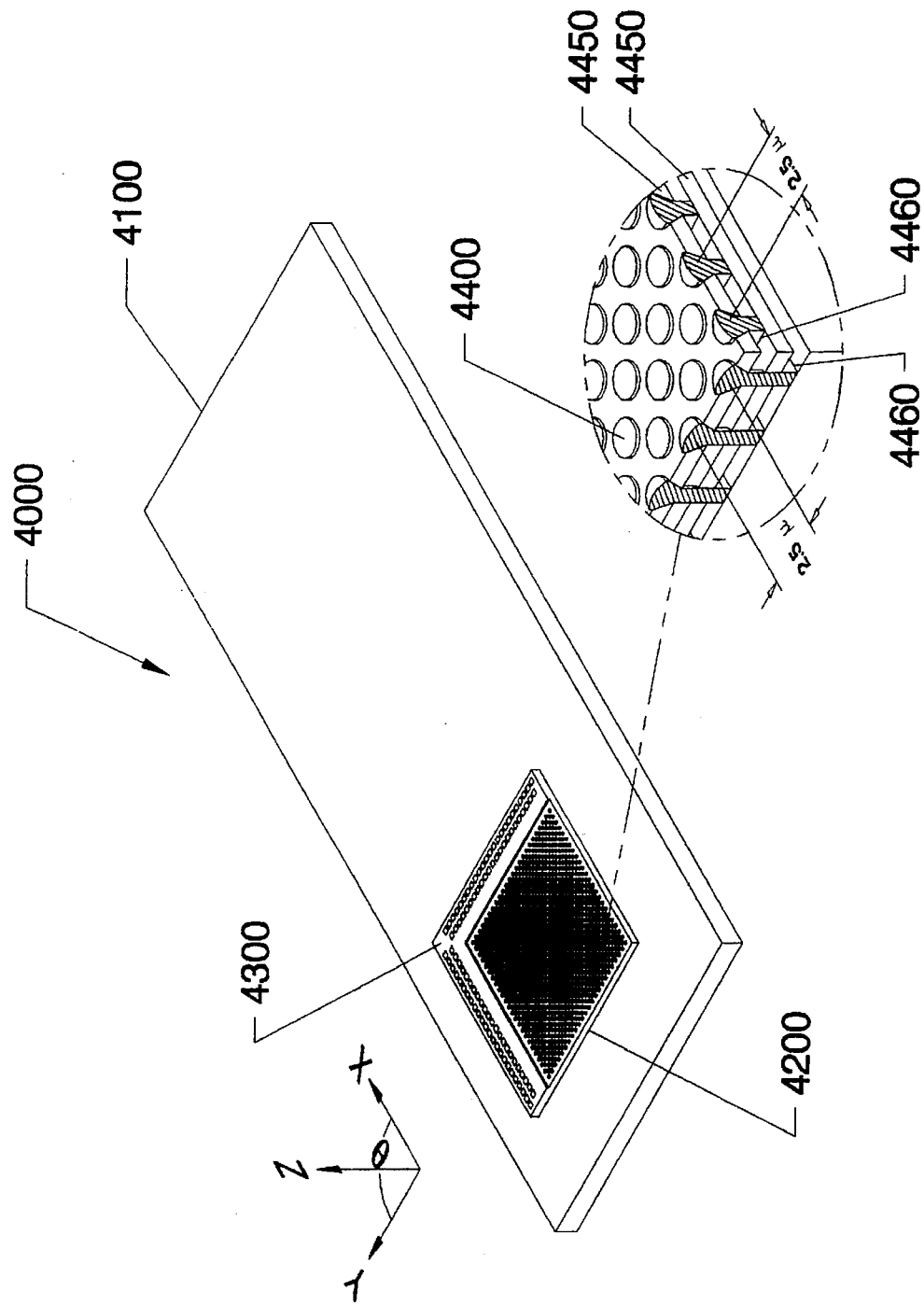

DIE SORTER

BACKGROUND OF THE INVENTION

The present invention relates to the field of semiconductor integrated circuits. The invention is illustrated in an example with regard a semiconductor integrated circuit handling apparatus and method therefor, but it will be recognized that the invention will have a wider range of applicability. Merely by way of example, the invention may be also applied to testing packaged integrated circuit devices, assembly operations, and others.

Industry utilizes or has proposed a conventional method to manufacture a semiconductor integrated circuit. In particular, the conventional method includes the steps of fabrication, wafer sort, assembly, and test in that order. Fabrication forms the individual dies onto a semiconductor wafer. Each of the individual dies is tested to determine its operability, typically at wafer sort. Wafer sort also identifies good dies from bad dies also known as rejects. Bad dies are often marked by either a probe or ink mark at the wafer sort operation, typically either during the same or different operation. Assembly packages each good or un-marked integrated circuit device, and test electrically tests the integrated circuit device for operability and at times reliability.

The conventional approach to sort each wafer relies upon the use of a wafer handling apparatus such as a wafer prober and a tester, typically either memory, logic, mixed signal, or the like, depending upon the type of die being tested. A limitation of the wafer prober includes its inability to process a different and often larger sized wafer. The wafer prober typically designed with a certain stage dimension is not often capable of handling wafers having a dimension larger than its designed stage dimension. As wafers become larger, wafer probers which have larger sized stages must be purchased or stages of old wafer probers with smaller stages must be changed to accommodate the larger sized wafers.

Another limitation of the conventional wafer prober relates to the cost of each tester and prober combination. For example, the wafer sort process is often a "bottle-neck" operation, that is, enough product throughput capacity often does not exist at such operation with certain downtime or non-productive time. Typically the quantity of tester and prober pairs available at the sort operation rarely exceeds the amount often needed to sort the wafers being processed, that is, without excessive downtime. In particular, the manufacturer often does not purchase extra testers nor probers at the sort operation because of the high cost of each tester and prober pair, typically running in the millions of dollars. Accordingly, wafer prober output must be consistent, that is, without excessive downtime or non-productive time, to maintain product flow through the wafer sort operation.

A conventional wafer prober set-up operation often contributes to the amount of downtime or more generally non-productive time. Each wafer prober should be set-up before a production lot of wafers is run through it. In particular, prober set-up typically includes certain mechanical adjustments to a probe card and the wafer prober, and a variety of electrical tests used to ensure the reliability and quality of the tester and prober combination being used. As integrated circuits become denser and the amount of bonding pads being tested increases, set-up typically consumes even more time and becomes more difficult to perform efficiently and accurately. Thus, the amount of set-up time continues to increase, thereby increasing the amount of non-productive time on each wafer prober.

A further limitation with the convention wafer prober includes the index speed of the wafer stage. As wafers become larger, the size of the wafer stage also increases proportionately. The larger sized stage often indexes at a slower speed than a smaller stage, often having a smaller diameter and weight. The slower index speed corresponds to slower input and output of wafers to each wafer prober, and therefore reduces wafer prober throughput capability.

Still a further limitation with the conventional wafer prober is the probe mark or scratch mark or ink mark often used to identify bad or reject dies. Specifically, the process of forming the marks increases the amount of time at the wafer sort operation. In addition, depending upon the accuracy of the product set-up, miss-operations typically also occur during the ink or probe mark step, thereby reducing the accuracy of the die per wafer. Further, a subsequent pick and place operation which separates good dies from bad dies often cannot easily recognize either the probe or ink or scratch marks accurately. This often causes miscounts between the sort operation and the pick and place operation, typically in the assembly area.

Another limitation with the conventional wafer prober comes from the increased cost of setting up a larger clean room for each new prober generation. As wafer size increases in diameter, a typical wafer prober also increases in size, that is, the foot print (floor space occupied by the machine) of each machine becomes larger for each succeeding generation of probers. The larger foot print of each machine occupies more clean room area which has been increasing in costs.

Still another limitation of the conventional wafer prober comes from the inability to test different product types on the same machine. As product lines become more diversified, industry needs a way to process and in particular sort or probe different product types on each machine. However, convention wafer prober technology tends not to allow for tests to be easily performed on die of different product types. Accordingly, wafer probers are often set-up to test only a single product type. When tests for multiple product types are needed, manufacturers typically purchase additional probers and testers to probe and test the additional product line, and thereby increase the flexibility of the manufacturing line. Accordingly the conventional technique for processing more than one type of product often becomes costly by adding more machines and creates more maintenance problems, often associated with the different types of probers and testers.

Still further, another limitation with the conventional wafer sort process includes the inability to characterize and/or bin integrated circuits often by speed through the use of a wafer map and separate similar integrated circuits from others on a wafer by way of separate cassettes, frames, magazines, or the like. For example, the conventional wafer prober probes and tests each die on a wafer. But the use of such wafer prober process cannot separate the similar die within a single wafer. The die often become separated at saw and re-categorized by speed at test. An engineer at test simply has no easy way to determine the wafer coordinate or location of the die when it enters the test area.

From the above it is seen that an apparatus and method for testing semiconductor integrated circuits that is low cost, is reliable, is flexible, performs at a speed substantially independent of wafer size, and requires little maintenance are often desired.

SUMMARY OF THE INVENTION

The present invention provides a die sorter apparatus and method therefor. The present die sorter apparatus handles semiconductor integrated circuits, and probes such integrated circuits for test purposes.

In a specific embodiment, the present invention provides a method of manufacture for a semiconductor integrated circuit. The present method includes the steps of providing a fabricated wafer comprising a plurality of semiconductor integrated circuits, and separating each of the semiconductor integrated circuits from the fabricated wafer. The present method also includes probing each of the semiconductor integrated circuits. A step of aligning each of the semiconductor integrated circuits to an interface means such as a probe card before the probing step is also provided. The present method further includes testing each of the semiconductor integrated circuits. An assembling step for each of the semiconductor integrated circuits after the testing step is further provided.

An alternative specific embodiment provides a method of manufacture for a semiconductor integrated circuit. The present method includes a step of testing a semiconductor integrated circuit by use of a die sorter. The present method also includes probing the semiconductor integrated circuit. The semiconductor integrated circuit is separated from a semiconductor wafer. An assembling step is also provided by the present method.

In a further alternative specific embodiment, the present invention includes a sort apparatus. The present sort apparatus includes input means for inserting a frame having a semiconductor integrated circuit thereon, pre-alignment means for aligning the semiconductor integrated circuit on the frame. The pre-alignment means uses a wafer map retrieved from a memory means. The present apparatus also includes first pick and place means for picking the semiconductor integrated circuit from the pre-alignment means, and alignment means for aligning the semiconductor integrated circuit. The alignment means receives the semiconductor integrated circuit from the first pick and place means. A second pick and place means for picking the semiconductor integrated circuit from the alignment means is also provided. The present apparatus further has probing means for receiving the semiconductor integrated circuit from the second pick and place means and probing the semiconductor integrated circuit, and die output means for removing the semiconductor integrated circuit from the probing means. The present apparatus may also include testing means for testing the semiconductor integrated circuit. An inspection stage is also provided.

A further specific embodiment includes a semiconductor integrated circuit testing apparatus which includes a die sorter. The present apparatus includes an x-y stage, a control means, and a motor movably coupled to a bearing track. The motor and bearing track are positioned onto the x-y stage. The present apparatus also includes a plurality of z-stages movably coupled to ride on the bearing track. The motor, bearing track, and control means allow each of the z-stages to move independently from each other. A z-mechanism disposed on the x-y stage is also provided. The z-mechanism elevates at least one of the z-stages when the at least one z-stages is positioned at a desired location of the z-mechanism.

A further alternative specific embodiment includes a method of identifying integrated circuits on a fabricated semiconductor wafer. The present method includes providing a fabricated wafer which has a plurality of semiconductor integrated circuits onto a wafer saw, and entering information such as an identification characteristic of the fabricated wafer into a memory coupled to the wafer saw. A step of sawing the fabricated wafer to separate each of the semiconductor integrated circuits is also provided. The present method also recognizes a wafer pattern from the semiconductor integrated circuit, and retrieves the wafer pattern for use at a die prober apparatus.

Still a further specific embodiment includes a pin array apparatus. The present apparatus includes a first dielectric layer which has an array region and a peripheral region. The array region includes first recessed regions protruding through the first dielectric layer. The present apparatus also includes a plurality of second dielectric layers under the first dielectric layer. The. second dielectric layers have second recessed regions, each of the second recessed regions being aligned with one of the first recessed regions. A plurality of rails laying between the dielectric layers are also provided. The present apparatus further has a plurality of pads located at the peripheral region, each of the pads coupled to at least one of the rails. A plurality of pins disposed through each of the first recessed regions and the second recessed regions from the array region is also provided by the present apparatus. Each of the pins including a pin head lays over the array region and a pin end is connected to at least one of the plurality of rails. A decoder is also coupled between the pads and the pins.

Further, an alternative specific embodiment includes a method of set-up for a probe card. The present method includes providing a pin array carrier assembly which includes a pin array top surface at a test site. The present method also includes adjusting the pin array carrier assembly to contact the pin array top surface with probes of a probe card. Steps of sending first signals to the probes and receiving second signals through the pin array top surface are also provided. The present method decodes the second signals, and identifies an X-coordinate, Y-coordinate, and THETA-coordinate of each of the probes through the decoded signals.

Still further, an alternative specific embodiment includes a semiconductor integrated circuit device interface card. The present interface card includes an elongated member having a first region and a second region, and a plurality of conductive members extending from the first region to the second region of the elongated member. The present interface card also includes a socket located at the first region. The socket has a plurality of pins where each of the pins connect to at least one of the conductive members at the first region. A plurality of conductive pads formed over the second region are also provided. Each of the conductive pads connect to at least one of the conductive members at the second region.

A further understanding of the nature and advantages of the invention will become apparent by reference to the remaining portions of the specification and drawings.

BRIEF DESCRIPTION OF THE DRAWINGS

FIGS. 16 and 16A are simplified illustrations of a set-up device according to the present invention;

DESCRIPTION OF SPECIFIC EMBODIMENTS

Wafer Manufacture Flow

Figure 1:
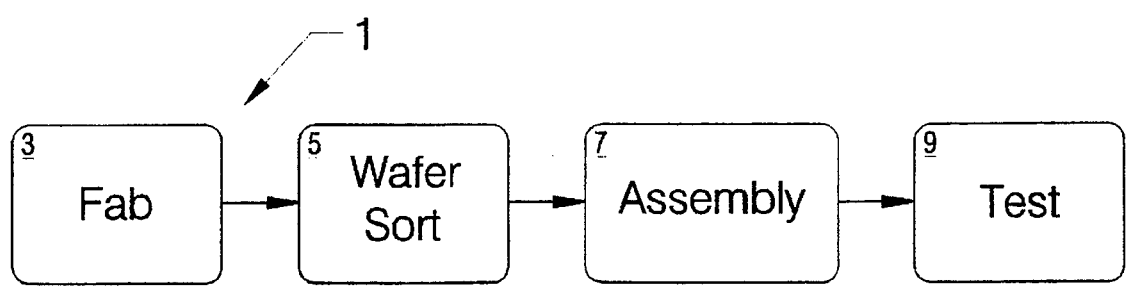
FIG. 1 is a flow diagram which illustrates a conventional sequence of product flow through main process steps used in the manufacture of semiconductor integrated circuits.

FIG. 1 is a flow diagram 1 which illustrates the conventional sequence of product flow through major steps used in the manufacture for semiconductor integrated circuits. The steps include fabrication 3, wafer sort 5, assembly 7, and test 9, typically taking place in the fabrication area, wafer sort area, assembly area, and test area, respectively. The fabrication step forms a completed semiconductor wafer, while the wafer sort operation tests each die on the wafer and identifies good dies from bad dies. The assembly operation separates all dies from the wafer and packages good dies. The test operation performs a detailed electrical test, and in some cases a mechanical test and even a visual inspection on each packaged die.

Figure 2:
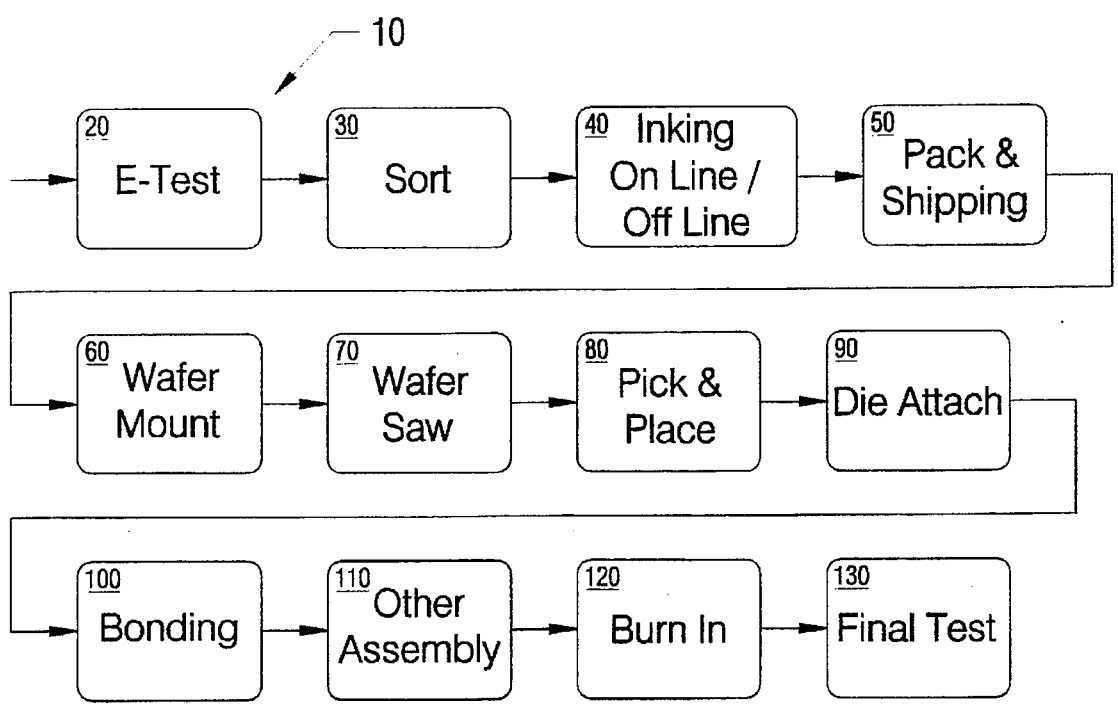
FIG. 2 is a typical process flow diagram for a conventional method of processing semiconductor integrated circuits.

FIG. 2 is a typical process flow diagram 10 for a conventional method of processing semiconductor integrated circuits and particularly for a method of testing integrated circuits on a semiconductor wafer. The process flow diagram includes e-test 20, wafer sort 30, inking 40, pack and shipping 50, (collectively known as operations at the wafer sort area) wafer mount 60, wafer saw 70, pick and place 80, die attach 90, bond 100, other assembly operations 110, (collectively known as operations at the assembly area) burn-in 120, and final test 130 (collectively known as operations at the test area).

The process flow of FIG. 2 begins by providing a completely fabricated semiconductor wafer which has not been electrically tested at the e-test 20 step, typically used to test electrical characteristics of special purpose silicon cell structures such as transistors, resistors, capacitors, and the like. The special purpose cell structures of the semiconductor wafer are often built into the "streets" of the semiconductor during fabrication. The "streets" lay between each die (or integrated circuit chip), and are also typically used as cutting lines during a subsequent wafer saw process. The e-test operation tests certain characteristics of the semiconductor wafer to sample for quality and reliability. Equipment used to perform the e-test operation includes at least a parametric tester and wafer prober.

The sort 30 process typically follows the e-test 20 operation. At sort, individual dies each located on the wafer are tested electrically by use of a tester and wafer prober combination. The prober handles each wafer being tested and provides the means that interfaces between each die to be tested and the tester. The wafer prober also includes hardware elements such as a stage, probe card, input/output interface circuits, and others. Each wafer prober is often hard wired with the tester to form the prober and tester combination.

The tester can be any suitable tester which may be used for the particular product type. Examples of testers include memory testers, logic testers, combinations thereof, and the like. Each tester often couples to at least one wafer prober and often to more than one wafer prober. Wafer throughput for the sort process (excluding downtime or non-productive time) is typically a function of die size, probing speed (or index speed), test time, among other factors. Further details of the wafer prober are described in the subsequent sections.

A conventional technique for identifying reject dies occurs through the inking 40 operation. Alternatively, either a probe mark or scratch mark also identifies reject dies. The inking operation is either an on-line process which takes place between each die (or dies) test by way of the wafer prober, or an off-line process. The off-line process electronically receives a wafer map identifying the bad dies from the previous wafer sort operation, and places an ink dot on each of the bad dies.

An operator performs a set-up for each inking assembly, and tunes each inking assembly such that bad dies are likely to be inked accurately, and good dies do not get inked. Unfortunately, the set-up and tune-up procedures are often difficult to perform accurately, and may cause good dies to be inked or cause bad dies to remain un-inked, thereby resulting in either less good dies or reject dies imposing as good dies.

An operator packs and ships 50 the wafers which have been through at least sort and inking. In particular, the operator visually inspects sample wafers and fills out necessary paper work, typically run cards (or lot summaries), shipping papers, and others. The quantity of good dies on each wafer (or die per wafer) is also reviewed by the operator and then transferred from the pack and ship operation to assembly. Of course, any miss-process at wafer sort or inking creates incorrect die per wafer counts as previously described. Miss-process often occurs byway of the conventional technique used by water sort and inking.

The assembly area receives the wafers which are typically in groups such as lots, and begins processing them. An incoming inspection operation is often performed on each lot of wafers. At the inspection operation, an operator performs various functions such as visually examines each wafer for ink or probe marks, counts each wafer from the lot for accuracy, reviews certain paperwork accompanying the lot, and others. The ink marks on each wafer often provide an indication that the wafers have been processed through the sort operation. However, the cumbersome nature of counting good dies or bad dies on each wafer tends to ensure that dies are not often counted for accuracy at the incoming inspection step. Accordingly, the assembly operation typically cannot easily verify the quantity of good dies received from the sort area.

Further assembly process steps include wafer mount 60, wafer saw 70, pick and place 80, die attach 90, bonding 100, and others 110. The wafer mounting apparatus mounts 60 each wafer onto a piece of mylar (or TR sheet) which is stretched over a frame, typically metal. Typically the wafers with frames (or full frames) are then stored and await before the saw process. The wafer saw process 70 cuts the wafer between each die for the purpose of separation. In particular, the wafer saw rotates a diamond rotary blade to cut into "streets" of the semiconductor located between each die to separate them from each other. The wafer saw does not count the quantity of dies either good or bad on each wafer.

The die attacher typically recognizes, aligns, and picks up good die from the full frame and places 80 each die onto a lead frame island for attachment. Typically attachment 80 between the die and lead frame island occurs through an eutectic or epoxy bond. Obviously, the capability of the die attacher to recognize and pick-up the good die over the bad die depends upon the quality of the ink mark or probe mark and die attach set-up quality.

An operator often counts or verifies the quantity of good dies at this process. For example, the operator simply counts the number of full and partial magazines of attached lead frames and calculates the quantity of good dies. It often occurs, however, that the quantity of good dies at die attach does not match the quantity of good dies transferred out of the sort operation, typically through a count discrepancy. The count discrepancy occurs through miss-count at sort, improper inking, poor handling, and others. Because no easy and accurate method for counting good dies at the process steps of inking, assembly inspection, saw, and others exist, it is often difficult to determine the operation where the count discrepancy had occurred.

The lead bonder 100 attaches wires of either aluminum or gold from certain bond pads on each die to their designated lead fingers on the lead frame. The other assembly operations 110 may include process steps such as mold for plastic packages, solder plate, tie bar cut, package and/or speed mark, trim/form, among others. The assembly process provides the fully packaged integrated circuit chips or dies to the test area.

The test operations receive the packaged dies from assembly and typically perform tests such as a first electrical test, burn-in operation 120, a final electrical test 130, typically a more detailed test than the first electrical test, and others. The first electrical test identifies chips which often have a clear failure such as an open, short, and the like. The first electrical test is typically a "fast" test and is used to remove bad packaged dies from the lot before the longer tests, often for efficiency in manufacture. A tester and handler pair often perform the first electrical test. Further details of the tester and handler pair will be discussed after this brief discussion of the burn-in operation.

The burn-in operation 120 heats and exercises the packaged dies for the purpose of removing marginal dies. In particular, a burn-in circuit board receives the packaged dies, and the burn-in circuit board with packaged dies insert into a burn-in oven which heats and exercises the circuitry of the packed dies. The burn-in operation often eliminates any marginal dies through the use of heat and exercise, typically by way of stressing each of the marginal dies.

The final electrical test 130 removes the good packaged dies from the bad packaged dies, and also categorizes both the good and bad dies. In particular, the tester and handler pair often receive the packaged dies from the burn-in operation, and identifies the good packaged dies and removes them from any bad packaged dies.

The handler and tester pair also identify the speed of each of the packaged dies, and the handler may categorize each of the packaged dies with similar speed by way of a different magazine. Once the packaged dies become categorized by speed grade, a marker apparatus grades each of the dies for speed according to each magazine. Though the speed of each of the packaged dies may be obtained at the wafer sort operation, there is no easy way of identifying and separating un-packaged die in wafer form by different speed grades. Accordingly, the speed grade for each integrated circuit is typically determined and categorized at the test operation, and such speed grade may be marked onto the package for identification purposes.

Typically the tester is of the same type as the tester used in the sort operation for the particular product. But the handler for the packaged dies differs significantly in machine type from the wafer prober. For example, the packaged dies handler is designed to handle packaged integrated circuits which have different features from dies on a wafer, typically probed and handled by way of a wafer prober. Accordingly, a semiconductor manufacture often relies upon at least two types of integrated circuit handling apparatus to handle integrated circuits in wafer form and packaged integrated circuits.

Pie Sort Flow

Figure 3:
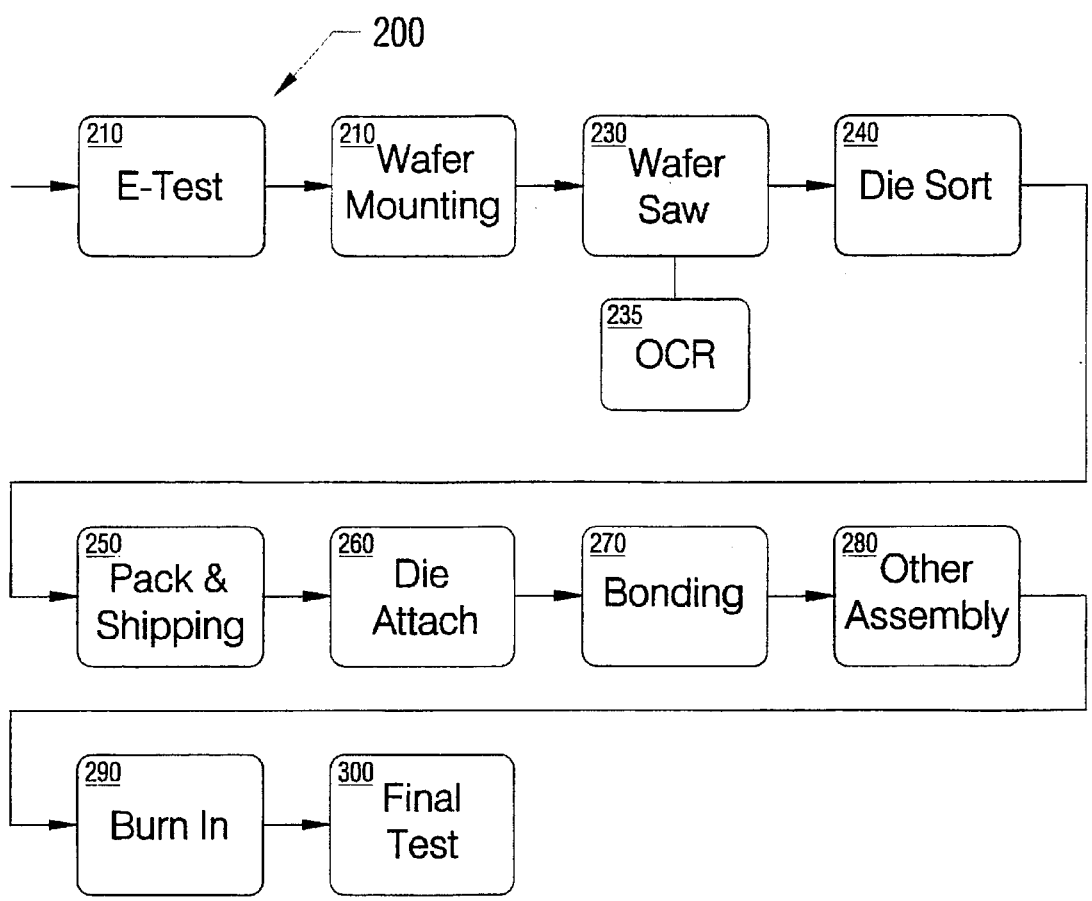
FIG. 3 is a simplified flow diagram for processing semiconductor integrated circuits according to the present invention.

An embodiment of the present invention is illustrated by the simplified flow diagram 200 of FIG. 3, which shows the present method of manufacture for a semiconductor integrated circuit. The present method includes steps of e-test 210, wafer mount 220, wafer saw 230, die sort 240, pack and ship 250, die attach 260, lead bond 270, other assembly operations 280, burn-in 290, and final test 300. The present method inserts the die sort 240 step after the wafer saw 230 step, and preferably eliminates the conventional wafer sort process and more preferably eliminates the use of the conventional wafer sort apparatus.

The assembly operations typically include the use of the wafer saw 230 apparatus and process. The wafer saw cuts each wafer into individual dies which are often attached to a mylar sheet (or TR-sheet) stretched over a metal ring or more generally a frame. The wafer saw process typically resides in the assembly area. But optionally, the wafer saw apparatus can be transferred into a wafer sort area for ease in product flow because the die sort process which may be located in the conventional wafer sort area follows the saw operation according to the present invention. Alternatively, the die sort process may be transferred into the assembly area for ease in product flow. Of course, the configuration of the process steps used depends upon the particular application.

Preferably, the wafer saw include an optical character reader (OCR unit) unit 235, typically defined as an apparatus used for data entry (either manual, semi-automatic, or automatic) and adapts to network capability. The OCR unit reads identification characters for each wafer before the cutting process, typically during wafer alignment, and stores such characters onto a memory device of a wafer handling means such as a wafer boat, wafer cassette, or the like. The memory device can be any suitable memory unit such as a touch memory, magnetic card, random access memory, optical card, electrically programmable read only memory, and others. The wafer identification characters include information such as wafer planarization characteristics, die size, product name, operator name, dates, process data, wafer quantity, and others.

The OCR unit may also store the wafer identification characteristics and a wafer map onto a memory means of another type of wafer handling means such as a metal ring, die tray, wafer frame, and the like, or more generally a frame-type wafer handling means. Each of the frame-type wafer handling means holds or stores no more than one wafer, typically in cut or sawed form. The frame-type wafer handling means allows the wafer identification characteristics and wafer map to accompany its wafer. The memory means can be any suitable memory such as a touch memory, magnetic card, random access memory, electrically programmable read only memory, optical card, and others.

Alternatively, the OCR unit may store such wafer identification characters onto a system network or the like for later use. The information stored by the OCR unit may follow each die through the remaining steps of manufacture, and in particular through the die sort operation. The OCR unit also provides the user of the system network an updated location of each wafer in work-in-process upon entry.

Certain wafer identification characters can also be entered onto either the system network or memory device through any suitable interface means such as a keyboard, bar-code reader, pen computer system, magnetic reader system, optical reader system, or the like. The interface means allows for example an operator to enter certain wafer identification characteristics into either system. Of course, the type of interface means often depends upon the type information entered.

In both the OCR unit example and operator interface means example, the network system often includes a back-up memory to preserve information which may be erased during system failures or the like. The back-up memory can be any suitable back-up apparatus and system software.

The use of the OCR unit is preferable because such unit provides a wafer map identifying the location of each die on the wafer, typically by use of X, Y, AND THETA coordinates. The location of each die on the wafer through use of the wafer map can be correlated to test data, reference data, or the like. An example of correlating test data with wafer coordinates is described in detail at later portions of the specifications.

The die sort 240 process probes and tests integrated circuits in die (or chip) form rather than wafer form. It should be noted that the term "die sort" as defined by the present invention is a method, process, or the like of testing semiconductor integrated circuits either packaged or un-packaged or the like in die form, typically a semiconductor integrated circuit which has been separated from the wafer.

The die sort process generally tests each integrated circuit, categorizes each tested integrated circuit, and separates each categorized circuit onto a separate die placement means such as a ring assembly, tray, die package, die tray, and the like, or more generally a frame. The die sort process also reads wafer identification information and wafer map information from the memories or the system network, and uses the information such as product type, wafer size, die size, product name, wafer count, wafer map, and the like to automatically or semi-automatically set-up a "die sorter" with the proper parameters.

The "die sorter" according to the present invention is an apparatus (die sort apparatus) used to perform the die sort process. The "die sort system" as defined by the present invention includes those elements such as a die sort apparatus, network system, probe cards, and others, often necessary to carry out the die sort process. Further details of the die sort operation and die sort apparatus may be realized by reference to the subsequent description regarding the die sort apparatus and flow charts.

Preferably, the die sort process relies upon an automatic or semi-automatic set-up procedure before the actual die probe and test (collectively known as die sort) of semiconductor integrated circuit product (e.g., production wafers). With use of at least the product name, the die sort system loads a recipe for the particular product by way of the network and interface means or the like. An operator typically adapts the die sort apparatus with a certain probe card which is used for that product. The probe card in use for the particular product should be calibrated to the die prober and test system. Various function devices adapts the die prober and tester to verify the set-up before operation of production wafers. A function device (function device A) 4000 of FIG. 16 may be used to verify the location (X, Y, Z, AND THETA) of each probe on the probe card for operability. Another function device (function device B) 5000 of FIG. 17 may be used to correlate the prober, probe card, and tester to a standard integrated circuit device, and still another function device (function device C) of FIG. 18 verifies the z-height difference between each probe pin, and may also be used to clean probe ends.

Function device A assists the die prober and tester to map each of the probes onto an X-AXIS, Y-AXIS, Z-AXIS, and THETA-AXIS space which will be referenced onto a standard set-up to ensure the operability of the die prober and probe card combination. For example each of the probes automatically or semi-automatically touch a portion of the top surface of the function device which includes an array or matrix of sense pins. The array of sense pins detect the location of each probe, typically through contact with at least one of the pins and use of a decoder and output pads. In particular, the detection occurs by sensing the physical contact of each probe end with the sense pin(s) (or even distance between the each probe end and sense pin) by use of any suitable parameters such as current, voltage, resistance, capacitance, and the like, typically provided through the probes by way of the prober and tester combination.

The test system receives an imprint of each probe through the array of pins, decoder, and output pads, and translates such imprint onto an X, Y, Z, and THETA space. The z-space (or z-height measured from the probe end to a fixed reference point) of each probe can be determined by use of the z-mechanism and contact with the array of pins. The imprint translates into a set of metrics for each probe card which will be compared to a reference metrics such as the standard set-up to ensure operability and quality of the probe card, and in particular each probe location. It should be noted that function device A can be used to measure the location and or planarity of a variety of apparatus such as a die collet, probe card analyzer, and the like.

FIG. 16 illustrates a simplified version of function device A 4000. Function device A 4000 includes at least a pin (or grid) array 4200, pads 4400, decoder 4300, and other elements, all positioned on a carrier plate 4100. The decoder can be any suitable array decoder such as a random access memory (RAM) array decoder or generally a memory array decoder, and the like. The carrier plate 4100 is typically an insulating type structure which has suitable planar characteristics and in particular structural features to allow for the accurate measurement of each probe pin. The pads 4400 (or input/output pads) positioned around the periphery of the pin array receive and transmit signals from the pin array.

FIG. 16A illustrates details of a simplified cross-sectional view of the pin array 4200. The pin array includes pins 4400 made of a suitable material such as tungsten or the like and conductive rails 4460, separated by insulation layers 4450. The insulation layers may include materials such as plastics, ceramics, silicon dioxides, and others. Each of the conductive rails 4460 connects to the pins 4400 to send and receive signals therefrom. Typically the decoder is coupled between the conductive rails and the pins. The conductive rails can be formed from any suitable material such as aluminum, tungsten, gold, copper, and the like. Each of the pins are spaced from each other at about 15 μm to about 0.5 μm, and preferably about 2.5 μm. A pin typically includes a flat head which is either round, square, or rectangular, depending upon the particular application. The width (or diameter) of each head is about 7.5 μm to about 0.25 μm, and preferably about 1.25 μm. The pins may also form a "checker board" type pattern, but may also form other patterns. Of course, the particular structure utilized depends upon the application.

The set-up also includes the correlation of the tester, prober, and probe card to a standard integrated circuit device (typically a packaged standard device) to ensure that the system operates accurately, that is, within design or specification tolerances. The correlation test relies upon custom software function device B, and a known standard device.

Figure 17:
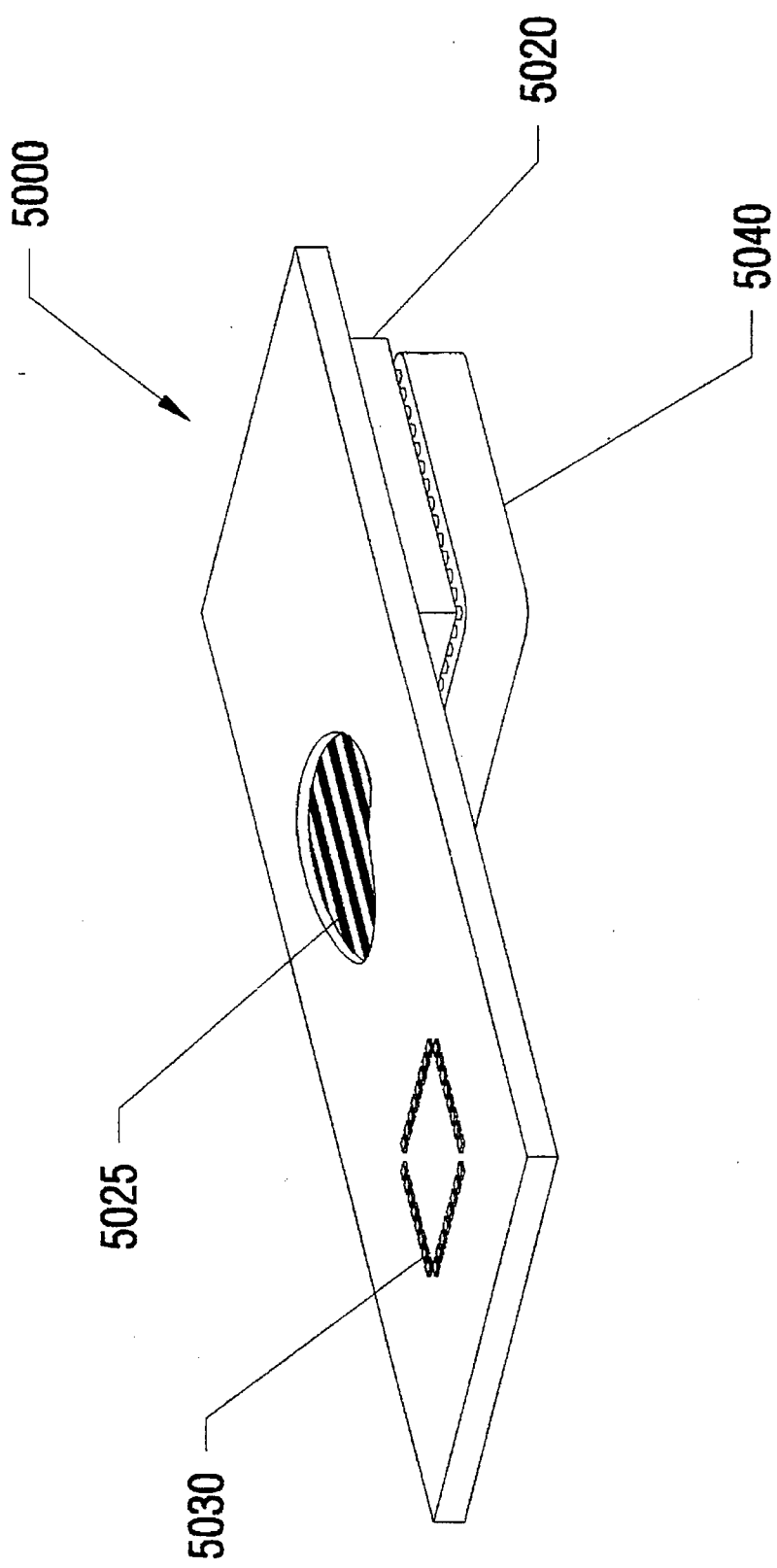
FIG. 17 is an alternative set-up device according to the present invention.

FIG. 17 illustrates an embodiment of function device B 5000 with use of the known standard device. Function device B includes at least a printed circuit board 5010, device socket 5020, and die pads 5030. The device socket can be any suitable socket for use with the known standard, typically the same type of socket for the particular package in use. The socket may also be in the form of a connector or the like for use as an interface to external circuitry in, for example, the tester or the like. The die pad includes a layout which often corresponds to the pattern of the pads for an unpackaged version of the known standard, and the locations of such pads allows such pads to come in contact to each of the probes of the corresponding probe card. The printed circuit board can be any suitable printed circuit board, but can also be any suitable member such as a plastic member, metal beam, and others capable of providing the appropriate electrical connections between the socket and pads, and providing enough structural strength. The printed circuit board includes conductive traces 5025 that connect the pad 5030 to the socket 5020.

In performing the correlation test, the known standard device is firmly placed into the device socket, and function device B loads into the device-under-test (DUT) site of the die prober apparatus. The custom test program is loaded into the tester. The die prober apparatus exercises the z-mechanism to connect the die pad pattern to the probes, located on the probe card. The tester then exercises (or tests) the known standard for operability, thereby correlating the tester by use with known reference data for the known standard. When the tester receives a "pass" signal from the test, production lots are then allowed to be processed on the die prober, tester, and probe card combination.

Figure 18:
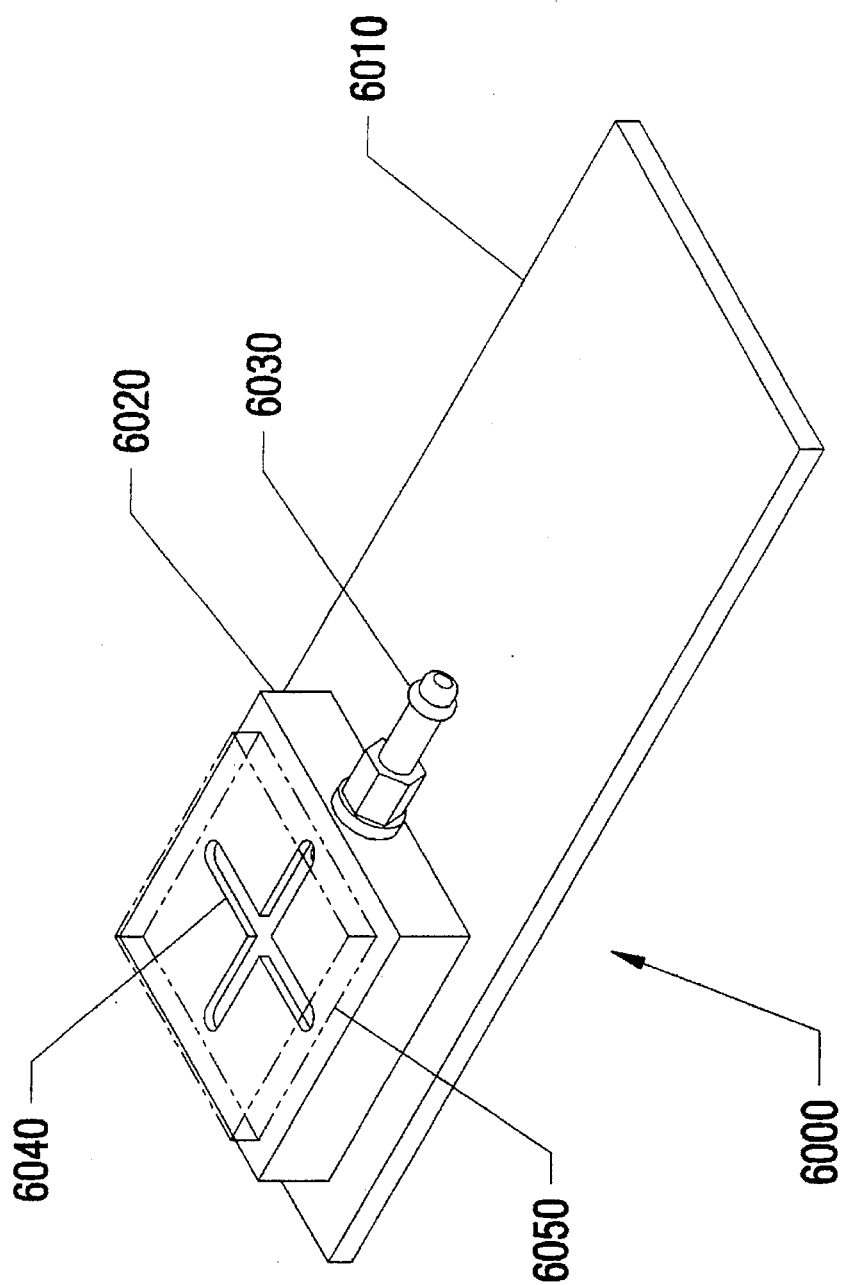
FIG. 18 is a further alternative set-up device according to the present invention.

FIG. 18 illustrates an embodiment function device C 6000. This function device in combination with custom software, probe card, die prober, and tester determines the planarity of each of the probes, relative to each other, and may also clean probe ends. Function device C includes a vacuum chuck assembly 6020 and shorting block 6050, all positioned on carrier 6010. The vacuum chuck assembly 6020 has vacuum connection 6030 (or vacuum nozzle) and vacuum orifice 6040. The carrier assembly with vacuum chuck assembly is positioned in the DUT position of the die prober apparatus. A shorting block is placed over the vacuum chuck, and vacuum is applied to such chuck to prevent the block from moving excessively.

The function device C assembly is indexed such that the top surface of the shorting block eventually makes contact with each of the probes located on probe card. The tester and prober determines the planarity of the probes relative to each other by measuring the z-distance (a distance measured from the end of the shortest probe to the longest probe end) needed to short each of the probes together on the shorting block, that is, have each of the probe ends touch the shorting block. This typically occurs while the function device C is being indexed. The z-distance is then compared to reference data to determine whether each of the probes of the probe card is within design tolerances to allow for production dies to be processed.

Function device C can also be used to clean the ends (or tips) of each probe, located on the probe card. For example, an oxide layer such as aluminum dioxide often coats the tips of probes after a period of probing bond pads, typically made of aluminum type material. When oxides from the bond pads build up on the probe tips, resistance between each of the probe tips and its pad increases. As resistance increases, the probe and test process tends to perform inaccurately. Accordingly, it is often desirable to clean the oxides off of each of the probe to ensure proper connection between each probe and pad.

The material used for the shorting block is typically hard enough to be used to clean off oxides from each of the probe ends, typically made of a tungsten type material. In particular, the z-mechanism exercises its index feature to scrub the tips of each probe against the top surface of the shorting block (also known as the scrubbing block). The scrubbing motion tends to clear off oxides from each probe end. After clearing the oxides, the probe operation tends to provide better contact between the probes and the pads. These set-up procedures are often followed by the operation of sorting production dies.

The shorting block can be made from any suitable material which has conductive characteristics and the desired hardness. Examples of such material include tungsten type materials (tungsten carbide), aluminum dioxides, silicon dioxides, and combinations thereof, among others. Preferably, the shorting block is made from the tungsten type material.

After die sort, each integrated circuit can be packed and shipped 250. Once categorized and packed onto a frame, die tray or the like, the dies can be sent to an assembly process for packaging or alternatively can be shipped to a customer through for example a die broker or the like. Since the die sort operation separates good dies from bad dies, only good dies ship to their designated locations. The conventional technique for shipping dies includes shipping both good and possibly bad dies. The conventional technique for shipping sorted wafers include shipping both good dies and bad dies.

The die attach process 260 aligns and picks each good die from the frame, and places the die onto an island typically located on a lead frame for attachment. Attachment often occurs through the use of a bond between the bottom of the die and the top of the island. The bond occurs by way of a technique such as an epoxy bond, eutectic bond, and others. Since only good dies exist on the frame, the die attach apparatus does not need to recognize bad dies, which have been removed at the previous die sort process. The process of aligning only good dies allows the die attach apparatus to be more efficient. Recognition of good dies over bad dies often takes additional time during the pick and place operation, and is often inaccurate. Accordingly, the die attach process becomes easier by the use of only good dies, provided by the die sort process.

In addition, the quantity of die product entering the die attach process should also match the quantity of good die obtained from the die sort operation, absent identifiable yield loss such as operator or machine miss-operations. Unlike the conventional wafer sort technique, the die attach process may immediately follow the die sort process. Accordingly, the die per wafer count from die sort should match the die per wafer count to die attach. This process flow eliminates the die per wafer count discrepancies which often exist between the wafer sort and assembly areas. In addition, the source of the die per wafer count discrepancy is often easier to locate through the use of the present process since die sort and die attach can occur in the same geographic area.

The bond process 270 provides wires or other connection means between each die and its lead frame fingers. In particular, a bond apparatus bonds a wire of either gold or aluminum from certain bond pads on the die to its lead frame finger. Typically no adjustments need be made to the bond process according to the present invention.

The other assembly operations include the assembly steps such as molding for plastic packages, tie bar cut, trim and form, solder plating, marking, and others. Typically no adjustments need to be made to the other assembly operations according to the present invention.

The packaged integrated circuit chip is tested at a test operation, typically through both a burn-in 290 and final test 300 step, and optionally through a first electrical test step. As previously discussed, the burn-in operation exercises each packaged device under a stressed condition for the purpose of identifying and eliminating marginal parts. The final test 300 operation electrically tests each packaged part for operability and in some cases reliability.

Optionally, the first electrical test may be performed before the burn-in operation to remove packaged integrated circuit chips that have clear defects such as opens or shorts. The first electrical test is used to remove bad dies which would eventually be removed at either burn-in or final test. Such process often improves the throughput of the entire test area including burn-in, final test, and others, depending upon the burn-in time and final test time of course, the procedures used in the test area depend upon the particular application.

Die Sort Apparatus

Figure 4:
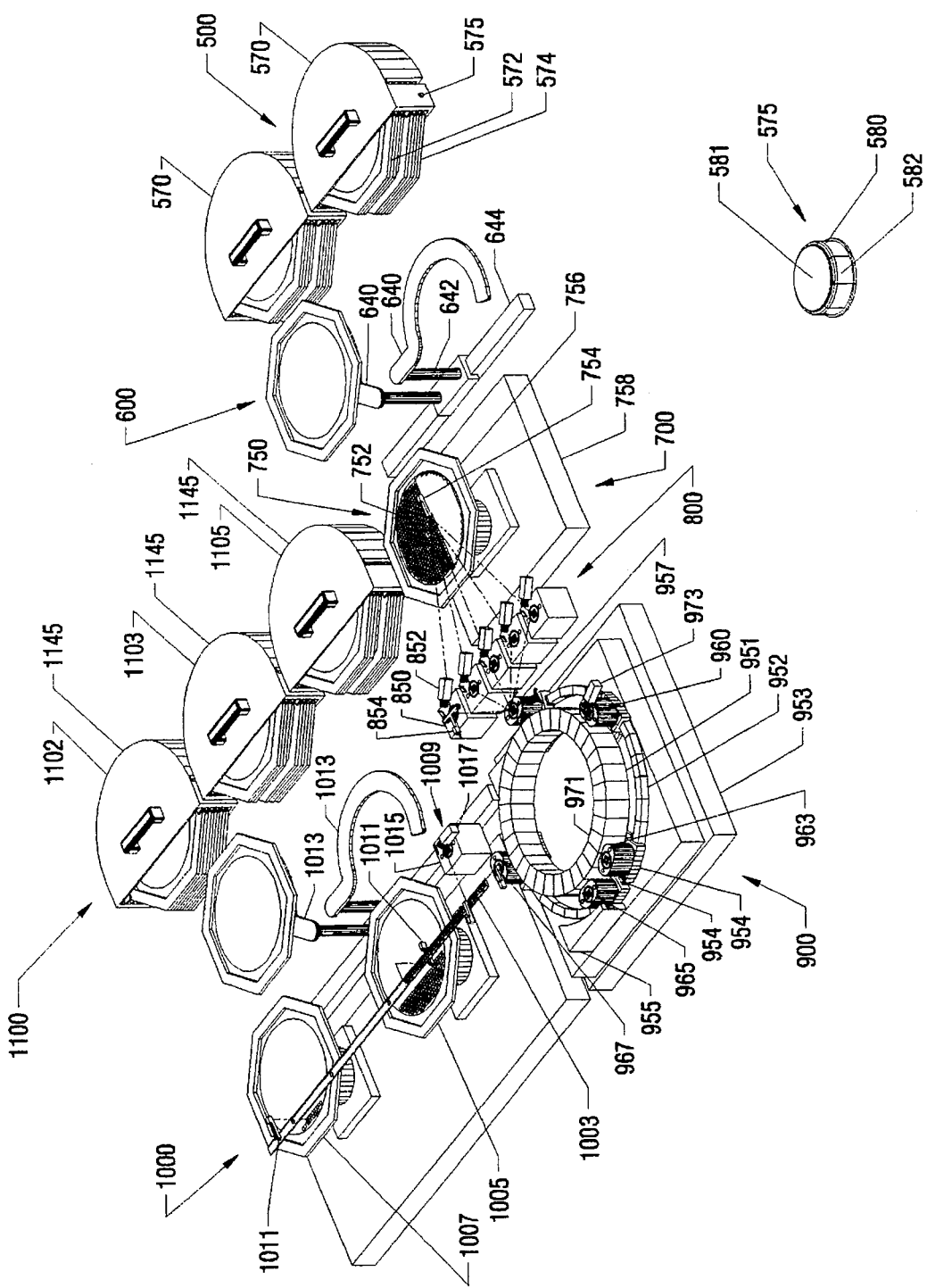
FIG. 4 is a simplified view of an embodiment of the die sort apparatus according to the present invention.

An alternative embodiment of the present invention is illustrated in FIG. 4 by the die sort apparatus 400. The die sort apparatus includes various subsystems (or substations) such as an input cassettes subsystem 500, input frame handling subsystem 600, frame to align subsystem 700, die align subsystem 800, die probe subsystem 900, die bin and die output subsystem 1000, output cassettes subsystem 1100, among others. Preferably, the die sort apparatus is operated such that at least one die is available at the die probe subsystem for test purposes most of the time. In particular, the die test step at the die probe subsystem often limits the operation of the die sort apparatus. Therefore the other subsystems should operate to provide dies to and remove dies from the die probe subsystem to keep at least one die under test, that is, excluding time typically necessary to index each die into the test site. Furthermore, present invention as embodied as the die sort apparatus of FIG. 4 is shown for illustrative purposes only, and may also be applied to a packaged die test handler, further variations of the die sort apparatus, and others.

The input cassettes subsystem 500 (ICS) includes hardware elements such as cassettes covers 570, load/unload elevators (not shown), cassette sensors (not shown), among others. The ICS can be generally defined as a load/unload apparatus that stores frames 572, 574 in cassettes. Each frame may be a frame with a cut wafer (or full frame) 574, typically a full frame received from the preceding wafer saw operation, or an empty frame 572 retrieved from the frame handling subsystem 600. Preferably, at least two input cassettes exist and are operated independently but in parallel to each other. Each of the cassettes can also include a touch memory device 575, typically inserted into a recess formed on a bottom surface region of each cassette. The touch memory device 575 has a contact surface 581 for a signal, and a ground cannister 580, both surrounding a core memory region 582.

The frame handling subsystem 600 (FHS) can be defined as a frame handling apparatus used between the ICS and frame to align subsystem. The FHS includes hardware elements such as frame handling arms 640, arm pivot means 642, frame handling base 644, and others. Generally, the FHS uses a frame handling arm to remove a full frame from the ICS and to position such full frame onto the frame to align subsystem 700, and in particular a die pick station 750. The frame handling arm also removes a completed frame (or empty frame) from the die pick station, and positions such frame into the ICS, and in particular the cassette. The FHS also includes a standby mode where each of the frame handling arms wait with either an empty frame or full frame or another.

Preferably, the FHS has at least two frame handling arms each of which handles either a full or empty frame. The FHS receives a product recipe from the main system controller before retrieving the first full frame in the cassette for each lot of wafers. After receiving the product recipe, the FHS retrieves the first full frame, and places such frame onto the die pick station. By way of a pre-set wafer map in the product recipe, the first full frame and all subsequent frames align on the die pick station, and each die on such frame is pre-positioned for pick and place. The FHS also feeds frames independently from the die probing subsystem, and in particular the die pick station.

The frame to align subsystem 700 (FAS) aligns each wafer for pick and place by way of the pre-align step and optionally through standard pattern recognition and wafer stepping techniques. The FAS includes hardware elements such as the pick and place station 750, pick and place means 756, motor and platen combination 758, and others. Also illustrated is a full (or partially full) frame 756 with individual dies 752. The pick and place means and motor platen combination can be any suitable pick and place apparatus and stepping motor and platen combination.

The die alignment subsystem 800 (DAS) is located between the FAS 700 and die probing subsystem 900. The DAS includes hardware elements such as alignment stages 850, inspection cameras 852, pick and place means 854, and others. Generally, the DAS receives die to be positioned over an alignment stage via the FAS pick and place means, aligns the die through an alignment unit, picks the die via another pick and place, and places the die onto the die probing subsystem.

Each alignment stage works in parallel to each other, but also independently from each other. An alignment stage receives a die from the FAS, holds the die through a vacuum, has a recognition unit with camera built thereon to facilitate the alignment of the die, and provides the alignment for the die through a motor means. There are typically more than one alignment stage, and preferably at least five die alignment stages all operated in parallel. Of course, the quantity of alignment stages depends upon the particular application.

The DAS aligns and preferably fine aligns an X-AXIS, Y-AXIS, and THETA-AXIS for the die on the alignment stage to a pick and place target region. The alignment accuracy of the DAS for the die is typically from about 4.5 µm to 15 µm, and preferably less than 5 µm. A pick and place apparatus moves the die from each alignment stage to a chuck located on a z-stage assembly of the die probing subsystem.

Figure 19:
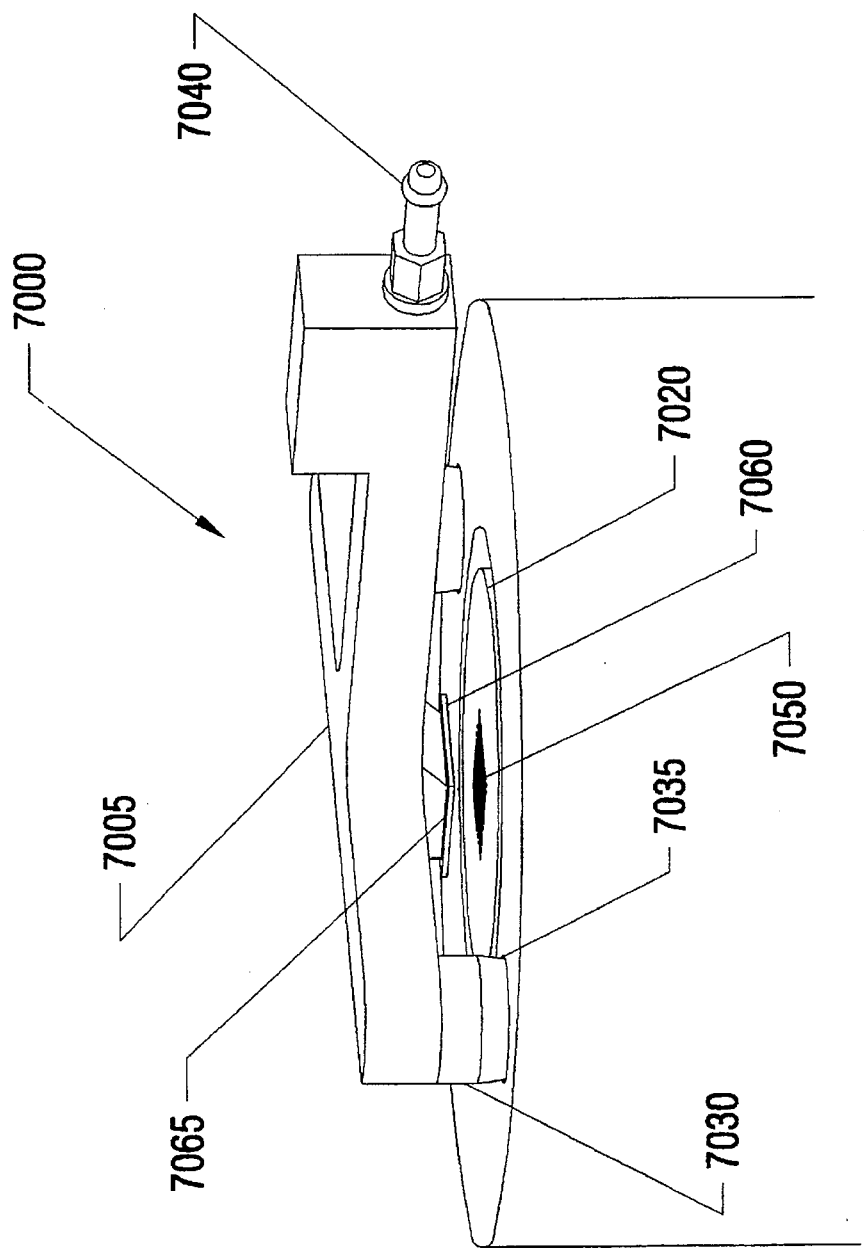
FIG. 19 is a simplified illustration of a pick and place transfer apparatus according to the present invention.

Preferably, the DAS relies upon a pick and place apparatus which has fine alignment characteristics. FIG. 19 is a simplified diagram of such pick and place apparatus 7000. The pick and place apparatus includes a pick and place 7005, alignment pins 7030, vacuum connection 7040, pick-up site 7065, and other elements. At least two pins align the pick and place apparatus with corresponding alignment holes 7035 located on a z-stage, thereby aligning the die 7065 with the chuck 7020. Each of the alignment pins include a diameter ranging from about 4.0 mm to about 0.5 mm, and preferably about 1.5 mm. Each of the alignment pins are also tapered in shape. The chuck includes a vacuum orifice 7020 to hold the die firmly in place. The taper and diameter of each pin and alignment holes are adapted to give an alignment accuracy of about 4.5 µm to 15 µm, and preferably less than 5 µm. The shape of the alignment pin and corresponding alignment hole (or region) can be cylindrical, square, rectangular, star-shaped, and the like.

The main system controller unit coordinates the motion of the ICS, FHS, FAS, and DAS such that the die prober system preferably becomes the limiting process, that is, the operation which takes the most time. By way of the multiple input cassettes, frame handling arms, and alignment stages, the main system controller unit coordinates the movement of each of these elements such that the die probing subsystem, and in particular the die test process becomes limiting.

The die probing subsystem 900 (DPS) receives, optically inspects, probes, and outputs each die. The die probing subsystem 900 includes various hardware elements such as a circular motor 951, circular bearing 952, x-y stage 953, z-stage units 954, z-mechanism 955, and others. The circular motor assembly has amplifiers and coils (collectively 971) for driving purposes. Each z-stage unit includes a chuck 957, 960, 963, 965, and 967 which receives the die from the DAS, and holds the die typically through a vacuum mechanism during each DPS operation such as inspect, test, stage, unload, and others. Each z-stage unit also moves on the circular bearing assembly by way of the circular motor assembly, often independently from each other.

For example a z-stage unit chuck of the DPS receives a die from the DAS through the use of the DAS pick and place. The z-stage unit then moves the die to an inspection station where the die can be inspected by use of a camera 973 and recognition unit to compare the die under examination with a known good die. The z-stage unit then moves the die to a test stage area to wait for any preceding die to finish the probe and test step. The z-stage unit moves the die from the stage area to the test site, elevates the die through use of the z-mechanism to connect the bond pads of the die the probes of a probe card. The DPS sends a begin testing signal to the tester, and the such tester tests the die for at least operability. After testing, the z-stage unit lowers the die also through the z-mechanism, and moves the die to the unload site. A pick and place means removes the die from the chuck of the z-stage unit.

The circular motor 951 and circular bearing 952 assembly of the DAS are pof the DAS are preferably linear. But such elements may also be of any other suitable characteristics. There are typically more than one z-stage unit, and preferably up to five z-stage units, each operating independently from each other. At least one z-stage and chuck combination are preferably positioned at the test site since the test operation is often the limiting process.

It should be noted that the present z-mechanism is often a high speed apparatus that allows the die to contact a probe card for test use at a faster rate than the conventional prober. The present z-stage mechanism moves at the faster rate because the present z-stage mechanism includes less mass. The mass of the present z-stage is about 350 grams to about 125 grams, and preferably less than about 250 grams. The z-mechanism also operates at a speed of about 1.5 mils (¹/₁,₀₀₀ inch)/millisecond, and preferably faster than about 2.0 mils/millisecond.

The other z-stage units move independent of the z-stage at the test site to the other operations. Of course, the movement of each z-stage relative to the z-stage at the test site should be configured such that at least one z-stage is at the test site all the time, that is, excluding any time for associated with the placement and removal of such z-stage.

The travel speed of each z-stage unit is between about 5 inches/sec. to about 10 inches/sec., but preferably at least 8 inches/sec. Each z-stage unit can also accelerate at a rate greater than four G-forces (or 4 times 9.81 m/s²). The speed and acceleration rate of each z-stage unit are often up to six times faster than the conventional wafer prober, and also facilities the movement of die to the test site which is often a limiting process, that is, absent the test time.

The die bin and die output subsystem 1000 (DBOS) removes die from the DPS for bin and output purposes, and optionally post inspection purposes. The DOBS includes system hardware such as a continuous loop track 1003, good die stage 1005, bad die stage 1007, post inspection apparatus 1009, pick and place means 1011, frame handlers 1013, and the like. The pick and place means at chuck 967 moves the die from the DPS to the continuous loop track 1003. Other pick and place means 1011 remove both good and bad dies from the continuous loop track for placement on either a good or bad die frame. The frame handlers 1013 transfer full frames and empty frames between the DBOS and output cassettes subsystem 1100. The post inspection apparatus inspects each die for probe marks, passivation damage, scratches, chips, cracks, other hard damages, and the like. As illustrated, the post inspection apparatus includes a recognition stage 1015 and camera 1017 combination. The post inspection apparatus can be of any suitable design known in the art.

The output cassettes subsystem 1100 (OCS) stores both full and empty frames, typically in cassettes. The OCS includes hardware elements such as cassettes for good die 1105, good or bad die 1103, and bad die 1102, cassette covers 1145, and others. The OCS receives full frames from the DBOS and places such full frame into its designated cassette, either good die, or good or bad die, or bad die, or other. The OCS also removes empty frames from the cassette for use at the DBOS. The OCS includes at least one cassette, and preferably at least three cassettes, all operated in parallel to each other. Of course, the amount of cassettes and their types depends upon the frames categorized, and in particular the bin types in use.

Figure 5:
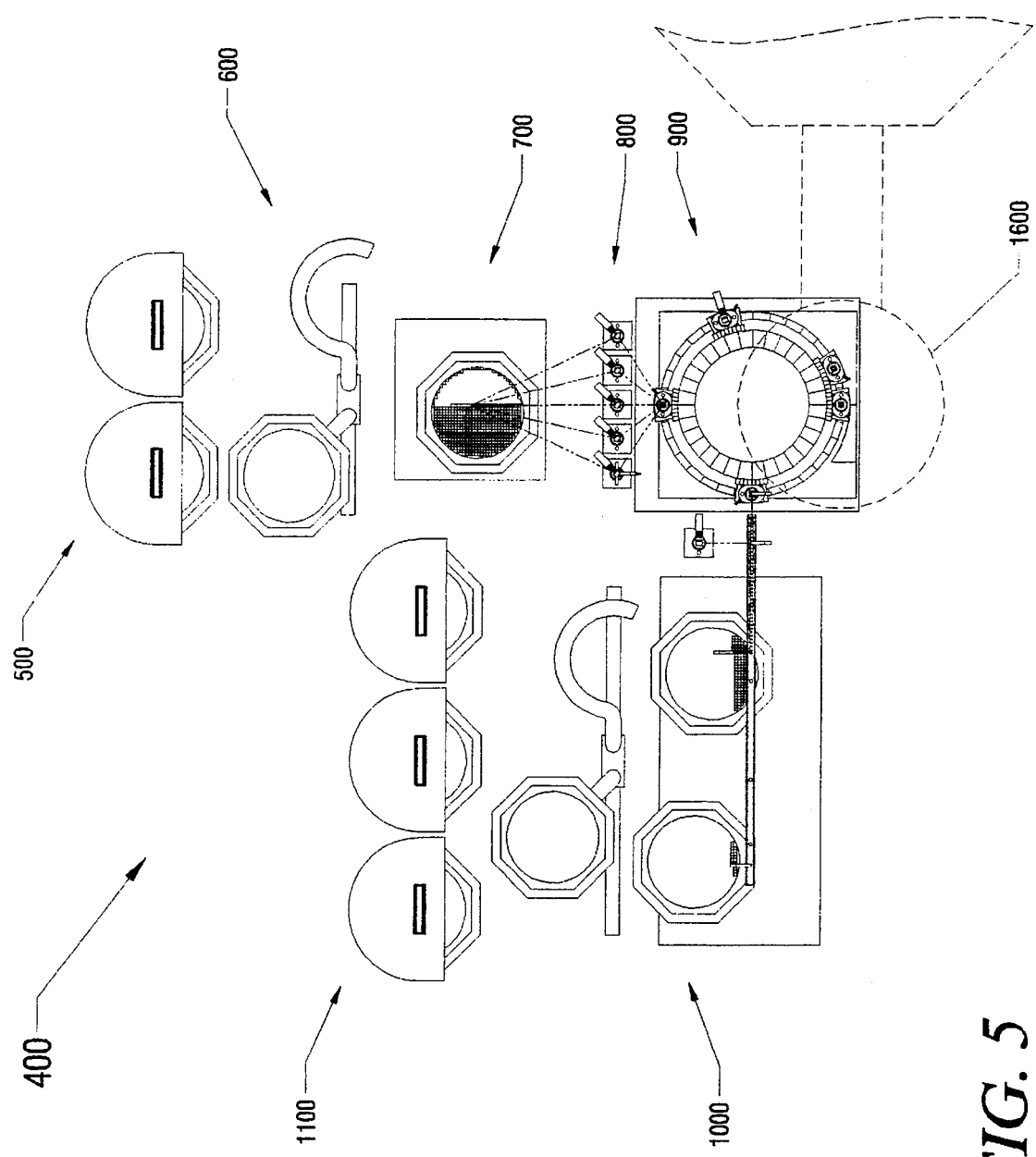
FIG. 5 is a simplified top-view of the die sort apparatus of FIG. 4.

A simplified top-view of the die sort apparatus 400 is illustrated by FIG. 5. The top-view includes the input cassettes subsystem 500, input frame handling subsystem 600, frame to align subsystem 700, die align subsystem 800, die probe subsystem 900, die bin and die output subsystem 1000, and output cassettes subsystem 1100. The dashed line represents a portion of the test apparatus system. Reference numeral 1600 illustrates the top-view of the test head apparatus also known as the test head.

Figure 6:
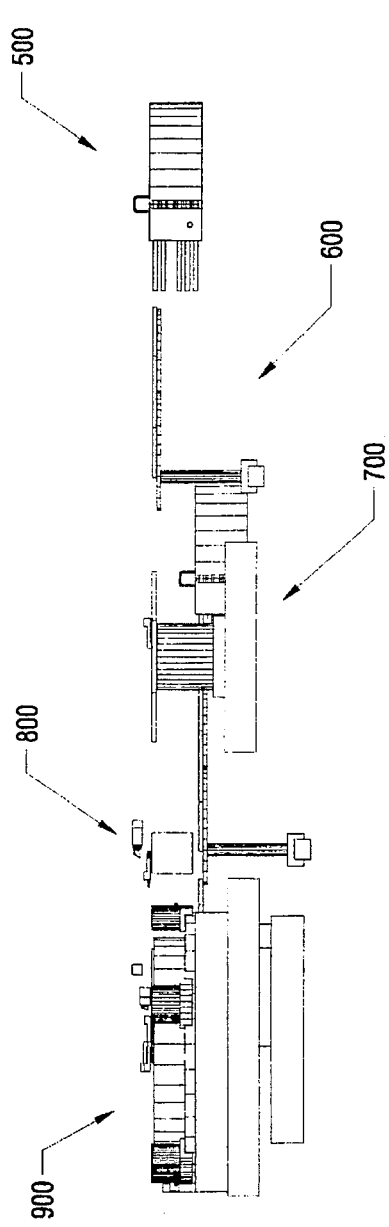
FIG. 6 is a simplified side-view of the die sort apparatus of FIG. 5.
Figure 7:
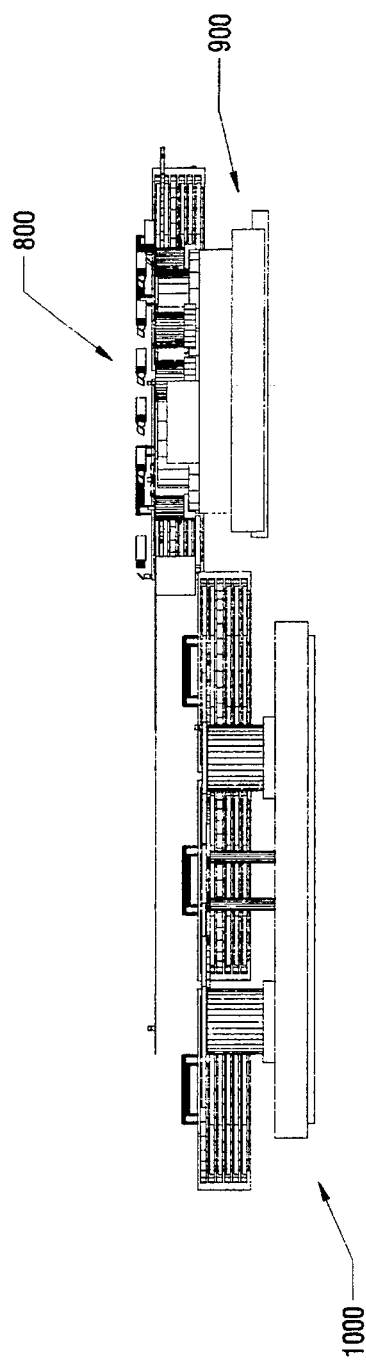
FIG. 7 is an alternative simplified front-view of the die sort apparatus of FIG. 5.

A simplified side-view of the die sort apparatus 400 is illustrated by FIGS. 6 and 7. The side-view embodiment of the FIG. 6 embodiment includes the input cassettes subsystem 500, input frame handling subsystem 600, frame to align subsystem 700, die align subsystem 800, and die probe subsystem 900. The alternative side-view embodiment of FIG. 7 includes the die align subsystem 800, die probe subsystem 900, die bin and die output subsystem 1000, and output cassettes subsystem 1100.

FIGS. 4–7 illustrate different views of the die sort apparatus embodiment. Each of the different views is shown for illustrative purposes only. The different embodiments as defined by the present invention may also be applied to a packaged die test handler, further variations of the die sort apparatus, and others.

Die Sorter Block Diagram

Figure 8:
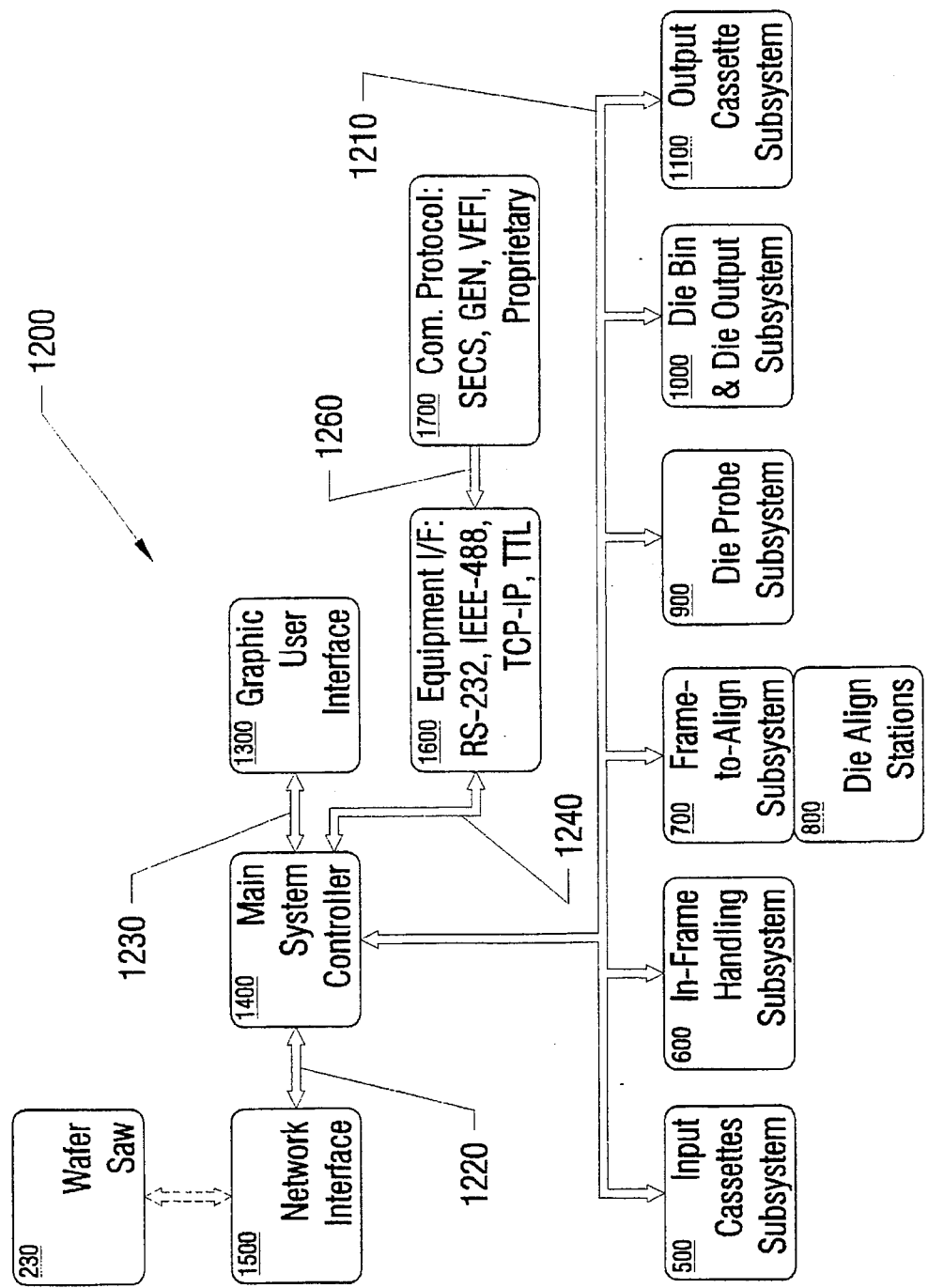
FIG. 8 is a simplified block diagram for system controller communications of a die sort apparatus according to the present invention.

FIG. 8 is a simplified block diagram 1200 for system controller communications of the die sort apparatus. The block diagram includes a main system controller 1400, graphic user interface 1300, network interface 1500, and equipment interface 1600. Each of the system elements 1400, 1500, and 1600 can be any suitable hardware/software combination, each of which communicates with the other with use of any suitable communication means. The network interface 1500 uses a communication protocol such as transmission communication protocol (TCP)/internet protocol (IP) suite, among others. The network interface connects to the system network which may be connected to other steps of manufacture such as the wafer saw 230 and others. The equipment interface relies upon a standard interface such as RS-232, IEEE-488, TCP-IP, TII, or the like. The graphic user interface can be any suitable user interface, and the communication protocol which transmits information to the equipment interface 1600 may use any suitable protocol means available.

The main system controller 1400 interfaces with each subsystem through a high speed communication bus, typically any suitable high speed bus known in the art. The subsystems include the input cassettes subsystem 500, input frame handling subsystem 600, frame to align subsystem 700, die align subsystem 800, die probe subsystem 900, die bin and die output subsystem 1000, and output cassettes subsystem 1100, among others. Each of the subsystems is described in more detail with use of the flow diagrams of FIGS. 9–15 below.

Input Cassettes Subsystem

Figure 9A:
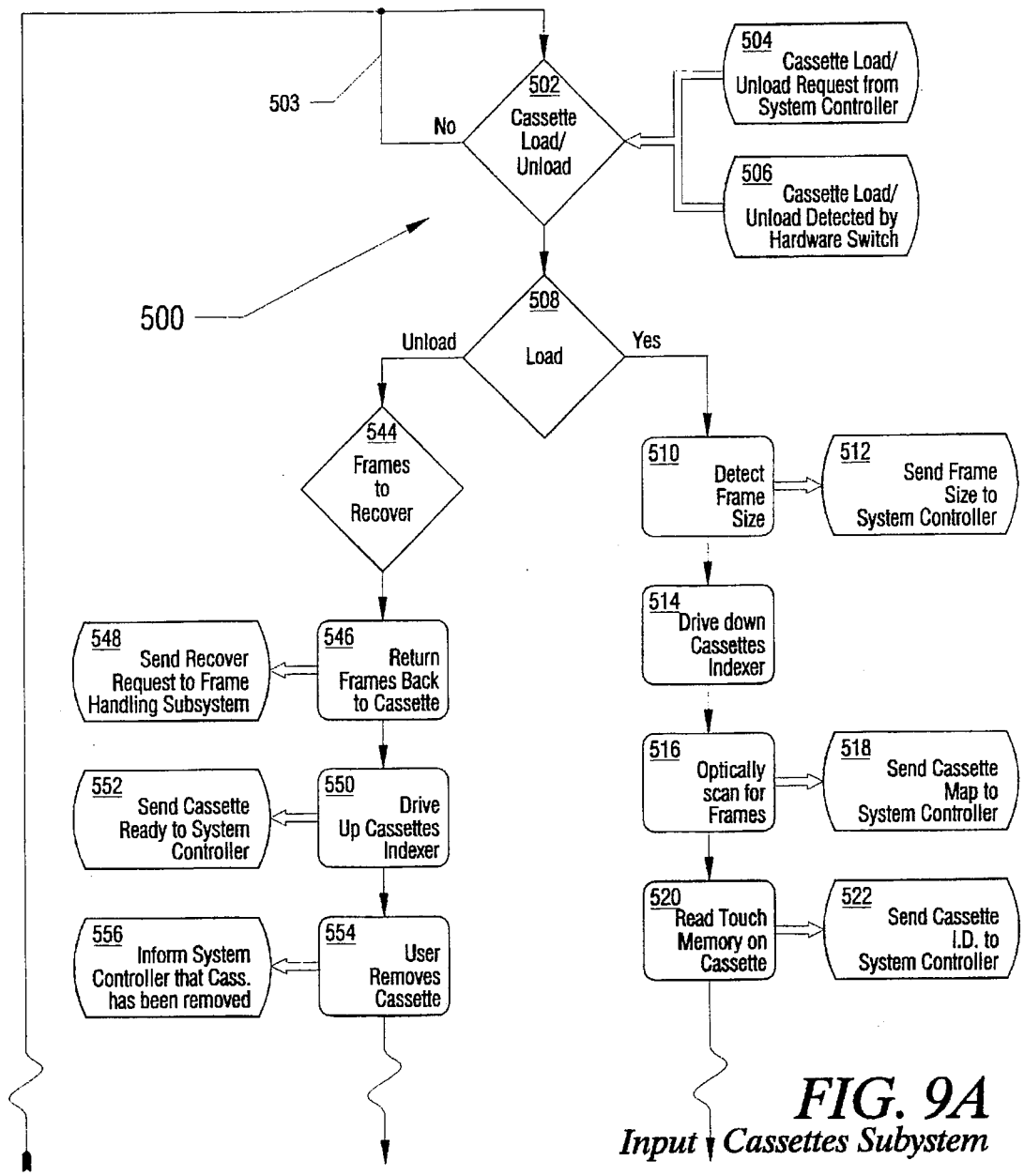
FIG. 9 is a simplified flow diagram for the input cassettes subsystem for the die sort apparatus of FIG. 8.
Figure 9B:
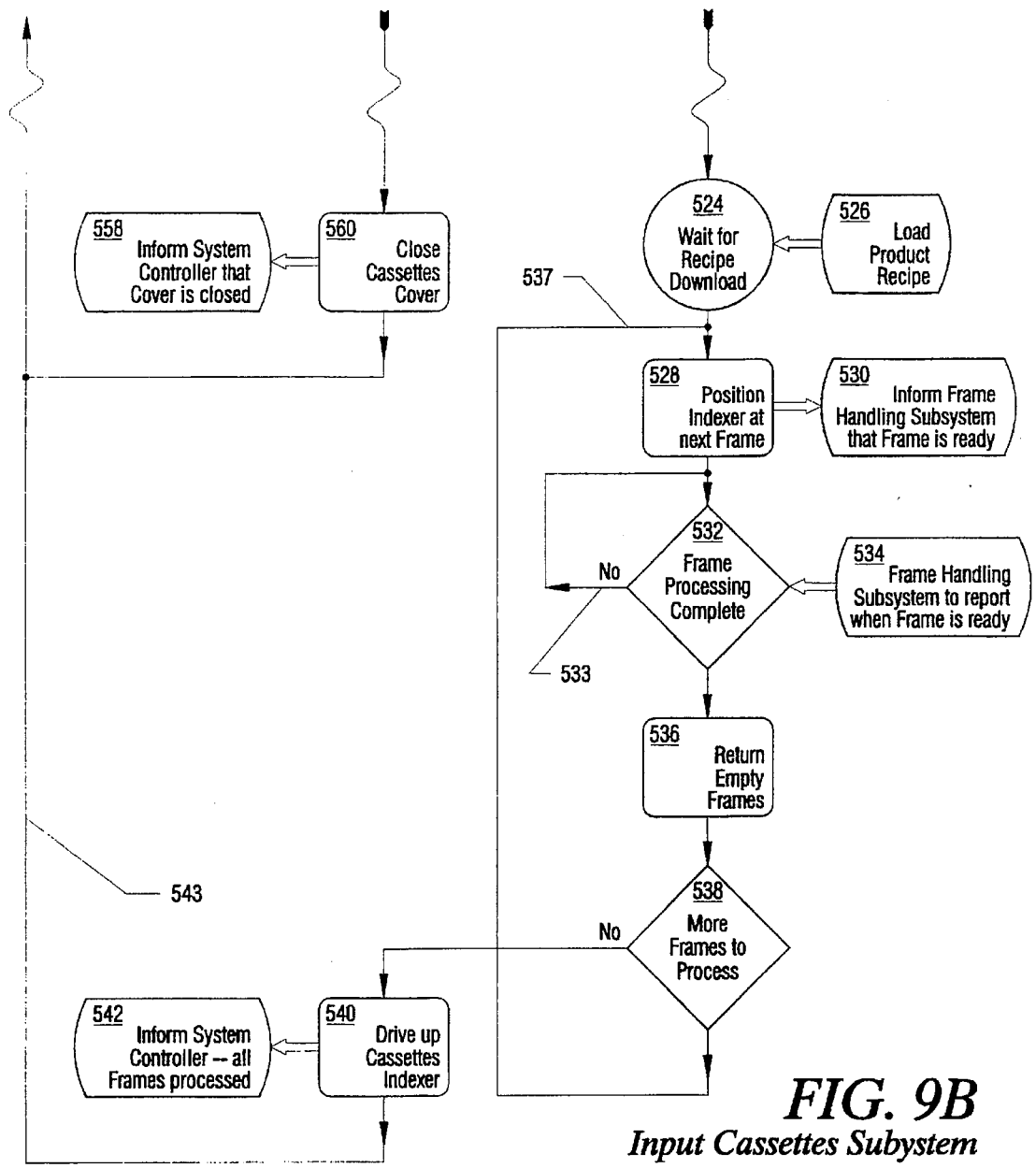

FIG. 9 is a simplified flow diagram for the input cassettes subsystem (ICS) for the die sort apparatus of FIG. 8. An explanation of various features of the input cassettes subsystem may begin at the cassettes load/unload function 502. The ICS receives the cut (or sawed) semiconductor wafers each of which is mounted on a frame and grouped into a cassette. The load/unload function 502 determines whether a cassette is to be loaded with a frame or unloaded with a frame by certain commands or signals received from the system controller 504 and a switch 506, typically a hard wired switch such as a mechanical switch, electrical switch, photoelectric switch, proximity switch, optical switch, and others.

The switch signal verifies the load/unload command received from the system controller by the position of the load/unload elevator to prevent the load/unload elevator from being in an improper position. Potential damage to cassettes, wafers, ICS, and the like often exists when the load/unload elevator is in the improper position for the particular load/unload function. Accordingly, it is often preferable to configure the switch to verify the state of the load/unload elevator for both load and unload functions.

The ICS receives a load request from the system controller 504. An operator or the like opens a cassette cover to expose the load/unload elevator, loads 508 a cassette full or partially full of frames with cut wafers (full frames) onto the load/unload elevator, and closes the cassette cover. The ICS detects 510 frame size from the cassette typically through a switch or the like, and sends 512 the frame size data to the system controller. The frame size data may provide the system controller with frame index information, typically used to set the index pitch at the load/unload elevator. An indexer means such as a motor assembly or the like drives 514 the frame load/unload elevator down to lower the cassette, and positions a full frame for use with an optical scanner 516. The optical scanner 516 scans the cut wafer on the full frame, and sends 518 a map of the scanned wafer as a wafer map to the system controller. The die prober apparatus relies on the wafer map during a subsequent alignment step to be described in more detail below.

The ICS reads 520 the cassette memory such as the touch memory to identify the cut wafers, and sends 522 the identification information to the system controller. The cassette memory typically contains product identification parameters such as product type, wafer size, lot number, and the like. By way of certain parameters such as the frame size, wafer map, wafer identification, and the like, the system controller identifies a recipe used for the particular product being processed, removes such recipe from memory storage, and loads (download) such recipe 526 into main memory, often while the ICS waits 524.

The indexer drives the load/unload elevator to position the full frame for pick-up by way of the frame handling subsystem 600. In particular, once the full frame becomes in position 528, the frame handing subsystem receives a "frame ready" signal 530 from the ICS. The frame handling subsystem removes the full frame from the ICS, and in particular the cassette, and moves the full frame to the frame to align subsystem 700. Before the frame handling subsystem moves the full frame, the frame handling system must often remove an empty frame or a frame without the cut wafer from the frame to align subsystem. Upon completion, the frame handing subsystem sends a "frame done" signal 533 to the ICS 532 to notify the ICS that the full frame has been transferred to the frame to align subsystem 700. The frame handling subsystem returns the empty frame 536 into an empty slot of the cassette. Alternatively, when the frame handing subsystem does not 533 report that the frame process is complete, the ICS continues to wait for the "frame done" signal until a certain number of iterations at which time an "error" message will be output, typically to flag an operator.

The ICS then waits for another full frame 538 to unload from the cassette. A sensor typically sends a signal to the ICS indicating that another frame exists. The ICS returns 537 to the position index function 528 once the ICS determines that the another frame exists. This sequence of steps 528, 532, 536, and 538 continues until all full frames have been unloaded, and no more full frames exist in the cassette.

When the cassette becomes full of empty frames, the indexer drives 540 the load/unload elevator to place the cassette in a reset state. The empty cassette is now ready for removal. The ICS sends an "all frame processed" 542 signal to the controller. The ICS cycle returns to the cassette load/unload function 502 to perform the cassette unload operations.

The ICS performs the unload operations to remove the cassette with empty frames. The system controller 504 as verified by a load/unload switch 506 sends an "unload" prompt to the ICS 502, or when no "unload" prompt exists, the ICS waits 503. The ICS is now ready to begin the various functions defined by the unload 508 branch of the flow diagram.

The unload 508 function begins operation of the various unload functions. The ICS looks for an empty frames to recover 544 from the frame handling subsystem. As previously noted, the frame handling subsystem returns empty frames back into the cassette 536, 546. The ICS requests for an empty frame 546 from the frame handling subsystem 548. The sequence of steps 544, 546, and 548 ensures that all empty frames to be loaded have been received by way of the frame handling subsystem to the cassette.

Once the frame handling subsystem stops input of empty frames into the cassette, the indexer drives the load/unload elevator to lift the cassette 550 in a position for removal, typically by an operator. At this position, a switch means typically sends a "ready" signal 552 to the main system controller which prompts an operator or user to remove the cassette. The operator opens the cassette cover to expose the cassette, and removes the cassette 554 from the input/output elevator. The ICS informs 556 the system controller that the cassette has been removed. The operator closes the cassette cover 560 and the ICS informs 558 the system controller that the cassette cover has been closed. The ICS returns back to the cassette load/unload function 502, and is now ready to either receive the next cassette with full frames or empty another cassette with empty frames. Of course, the operation performed depends upon sequence of the particular application.

Frame Handling Subsystem

Figure 10A:
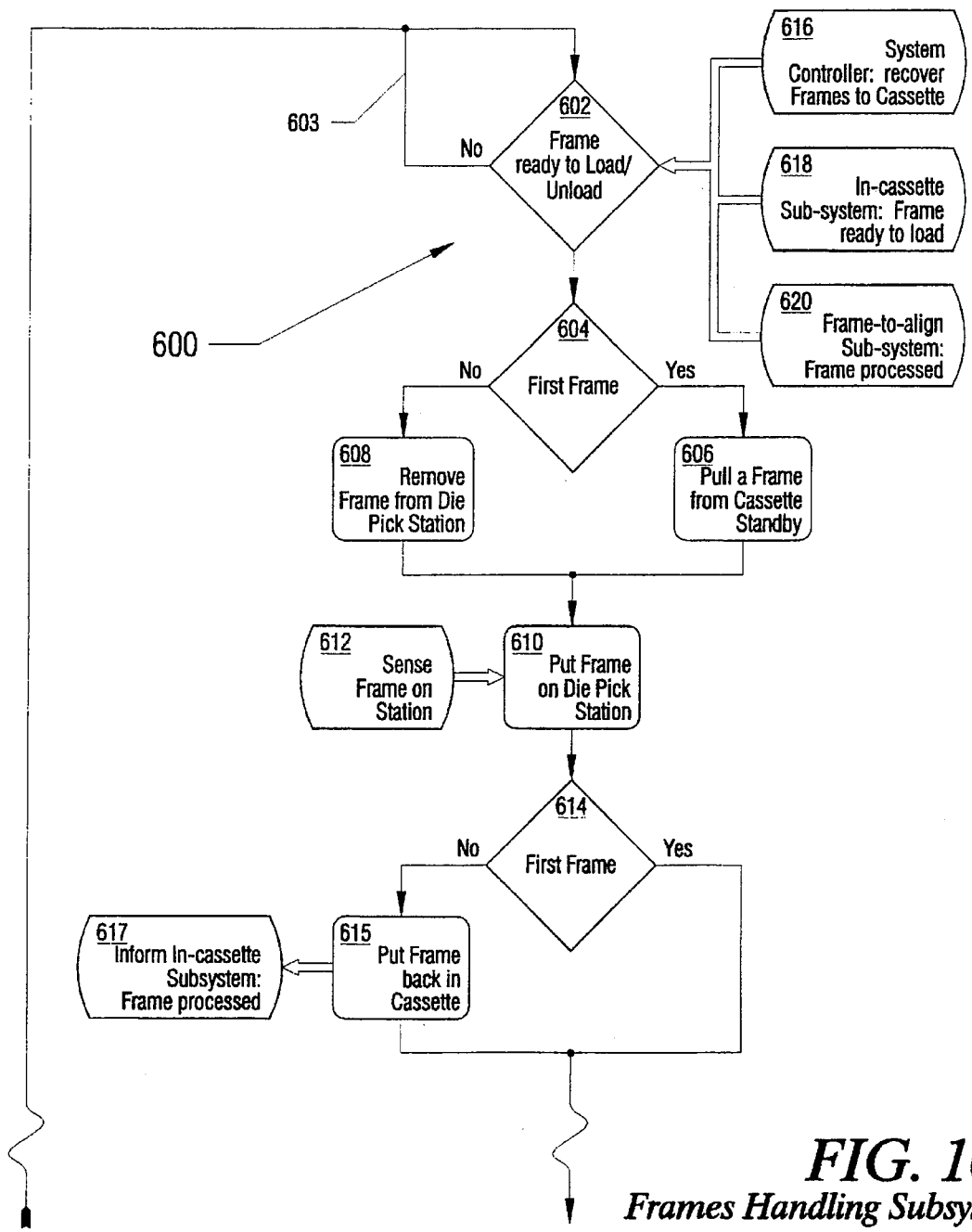
FIG. 10 is a simplified flow diagram for the frame handling subsystem for the die sort apparatus of FIG. 8.
Figure 10B:
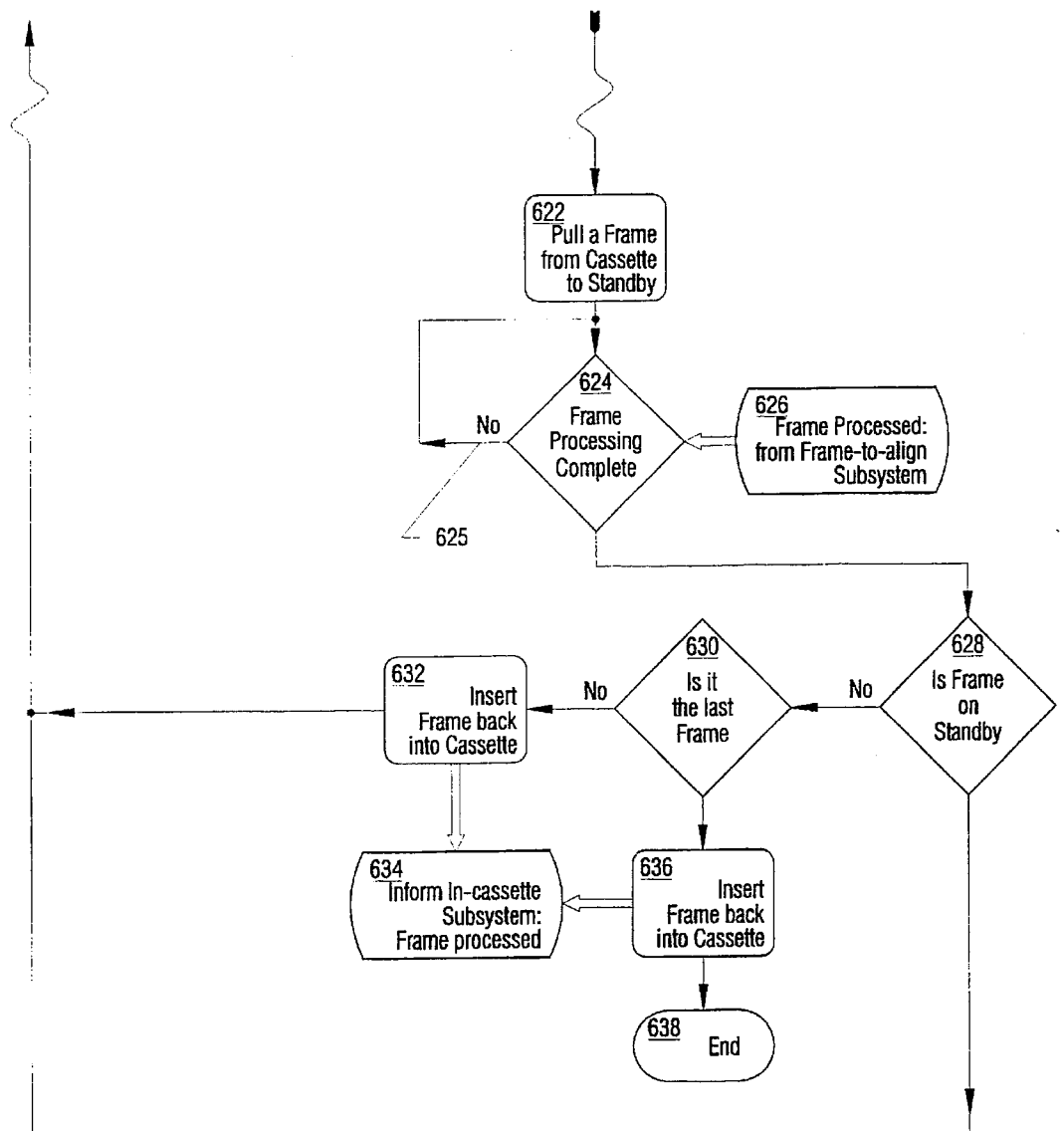

FIG. 10 is a simplified flow diagram for the frame handling subsystem for the die sort apparatus of FIG. 8. The frame handling subsystem may begin operation at the frame ready to load/unload function 602. The frame handling subsystem (FHS) determines whether a full frame is ready for process from use of signals from the main system controller 616, input cassettes subsystem 618, frame to align subsystem 620, and others. When the start signals are received from 616, 618, and 620, the FHS proceeds to the first frame 604 function. Alternatively, FHS waits 603 for the start signals from 616, 618, and 620.

At function 604, the FHS determines whether the full frame to be processed in the cassette is a "first" full frame or another full frame, typically any full frame after the first full frame. With a first full frame, the FHS by way of a first frame handling arm removes the first full frame from the ICS and holds the first frame in standby 606. With another full frame, the FHS removes an empty frame with use of a second frame handling arm from the die pick station and holds such empty frame in standby. The FHS uses the first handling arm 610 to place the first full frame onto the die pick station. The FHS receives a "sense frame" 612 signal when the first full frame has been properly placed on the die pick station.

With the first full frame 614 example, the FHS with use of the first handling arm pulls 622 another full frame from the cassette and holds such frame in standby. But with the other full frame example, the FHS with use of the second arm inserts 615 the empty frame back into the cassette, and informs the ICS 617 that the empty frame has been processed. The first handling arm is now in standby and the second handling arm is empty and ready for use.

The FHS waits for the full frame at the die pick station to be processed 625. The FHS receives a signal from the frame to align (FTA) which informs the FHS that the frame has been processed. The FHS now looks for an arm which is in standby with a full wafer. In this example, the first handling arm is in standby and the FHS now returns to function 602 to repeat the FHS operations.

Alternatively, when both arms do not have full frames, that is, neither the first nor the second handling arm is in standby, the FHS looks 630 for a last empty frame from the die pick station. If the empty frame is a last empty frame, the FHS inserts such last empty frame into the cassette 636, informs the ICS that the frame has been processed 646, and the process ends 638. However, any other empty frame other than the last empty frame returns to the cassette through the use of the FHS which also informs the ICS that the empty frame has been processed 634, and the FHS process returns to function 602. It should be noted that the preceding sequence of steps illustrates one example of the FHS process. Other FHS process. sequences may also be used depending upon the particular application. In addition, the simplified flow diagram of FIG. 10 is shown for illustrative purposes only, and should not in any way limit the scope of the claims herein.

Frame to Align Subsystem

Figure 11:
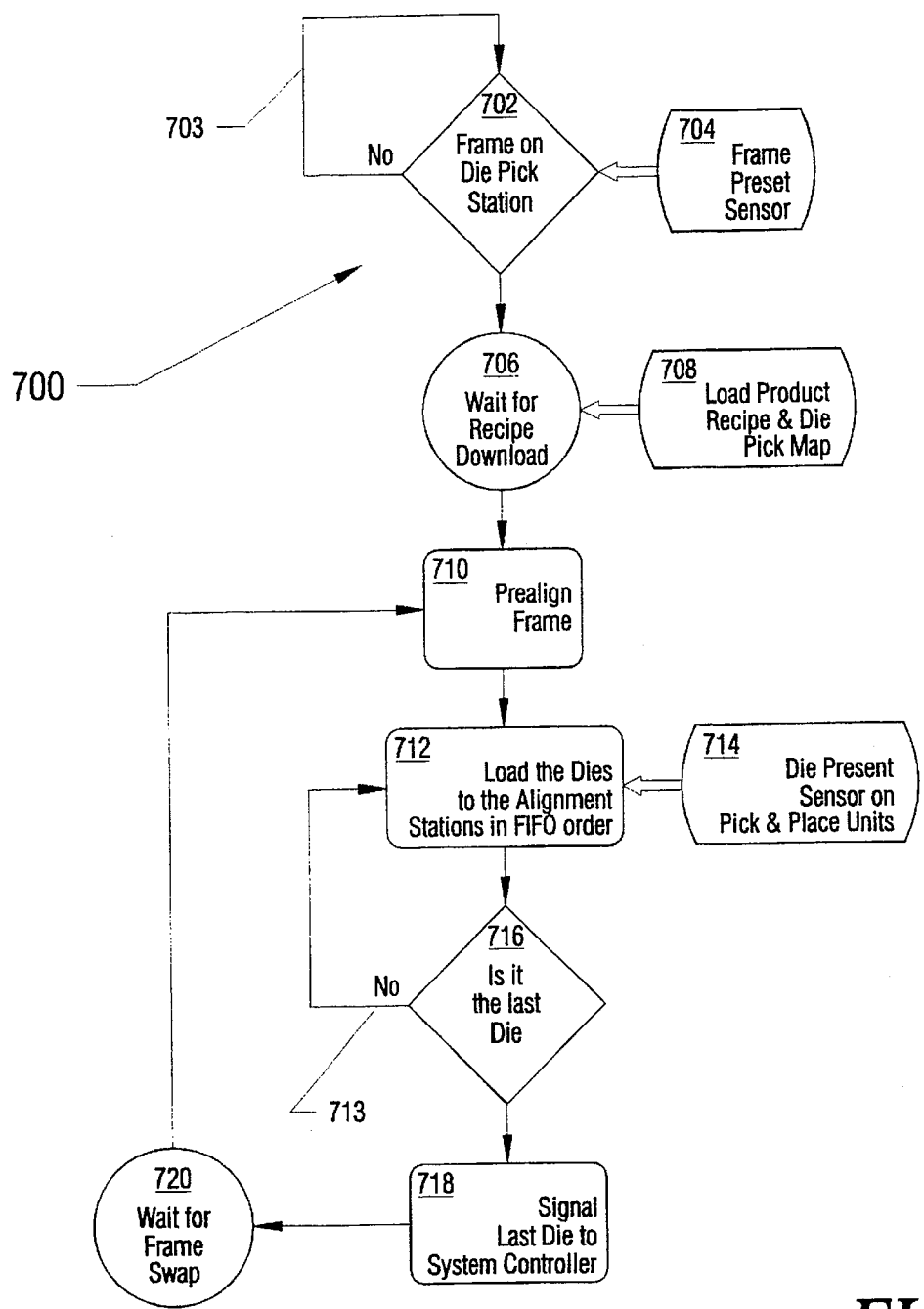
FIG. 11 is a simplified flow diagram for the frame align subsystem for the die sort apparatus of FIG. 8.

FIG. 11 is a simplified flow diagram for the frame to align subsystem 700 for the die sort apparatus of FIG. 8. Operation of the frame to align subsystem (FAS) begins at for example function 702. The FAS looks 702 for a full frame on the die pick station by way of a sensor such as a frame pre-set sensor 704 or the like. When no full frame exists on the die pick station, the FAS waits for one, typically corresponding full frames from another production lot. Once a full frame becomes positioned onto the die pick station, the FAS waits 706 for the product recipe corresponding to the product type being processed. The product recipe includes information such as the wafer map, product type, lot number, and other information. The main system controller loads 708 the product recipe and in particular the wafer map for the FAS. The FAS by use of the product recipe and in particular the wafer map pre-aligns 710 each die on the full frame for pick and place.

The die pick stage recognizes and aligns each die for pick and place. In particular, a die present sensor 714 recognizes the availability of the die for pick-up and flags the pick and place. The pick and place 712 moves the die from the die pick station to a die alignment station. Preferably, pick and place occurs in an orderly manner such as a first-in-first-out or the like. The steps of recognition, alignment, and pick and place continue 713 until all dies are removed from the full frame. At the last die 716, the FAS sends a "last die" signal to the main system controller, and waits 720 for the handling arm to pick up the empty frame from the die pick station and position a next full frame. The next full frame is positioned on the die pick station which should be of the same product type as the previous full frame, and therefore pre-aligns with use of the same product recipe. Of course, any different product type on the die sort apparatus will be adapted by its product recipe for operability.

Die Alignment Subsystem

Figure 12:
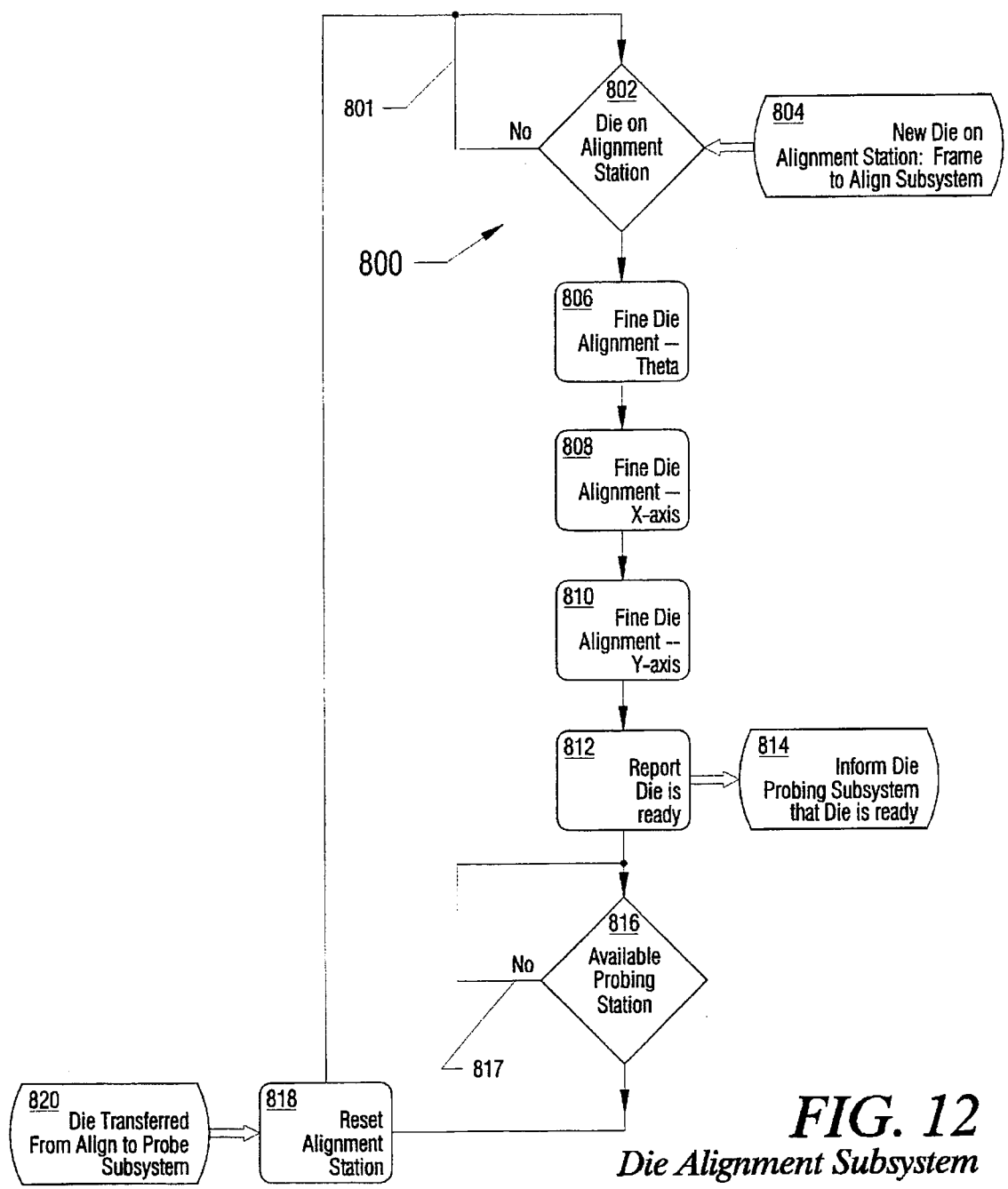
FIG. 12 is a simplified flow diagram for the die alignment subsystem for the die sort apparatus of FIG. 8.

FIG. 12 is a simplified flow diagram for the die alignment subsystem 800 for the die sort apparatus of FIG. 8. The operation for the die alignment subsystem (DAS) begins at for example function 802. The DAS and in particular an alignment station receives 802 a die from the FAS, and at such time the FAS sends a "new die" signal 804 to the DAS. Otherwise, the FAS waits 801 for a die. By way of the wafer map, the FAS already performed a rough alignment on each die to be picked and placed. The DAS and in particular the alignment station performs a fine alignment of the THETA-AXIS 806, X-AXIS 808, and Y-AXIS 810 of each die 812.

The DAS sends a "die ready" signal to the die probing subsystem 814 upon fine alignment. When the DAS receives a "chuck ready" signal from the die probing subsystem, the DAS pick and place removes the die from the FAS alignment station and places the die onto the die probing substation, and in particular a chuck. Alternatively, FAS waits 817 for the "chuck ready" signal from the die probing substation before placing the die onto the die probing substation. When the DAS receives a "transferred" signal 820 from the die probing substation, the DAS resets alignment onto another die to be picked and placed, and DAS operation returns to function 802.

The simplified flow diagram of FIG. 12 is shown for illustrative purposes only. There are typically at least two DAS alignment stations, and preferably up to five or more of such alignment stations. Each of these stations operate in parallel to each other, but independently from each other. Of course, the exact configuration of the operation of each of the alignment stations depends upon the particular application.

Die Alignment Subsystem

Figure 13A:
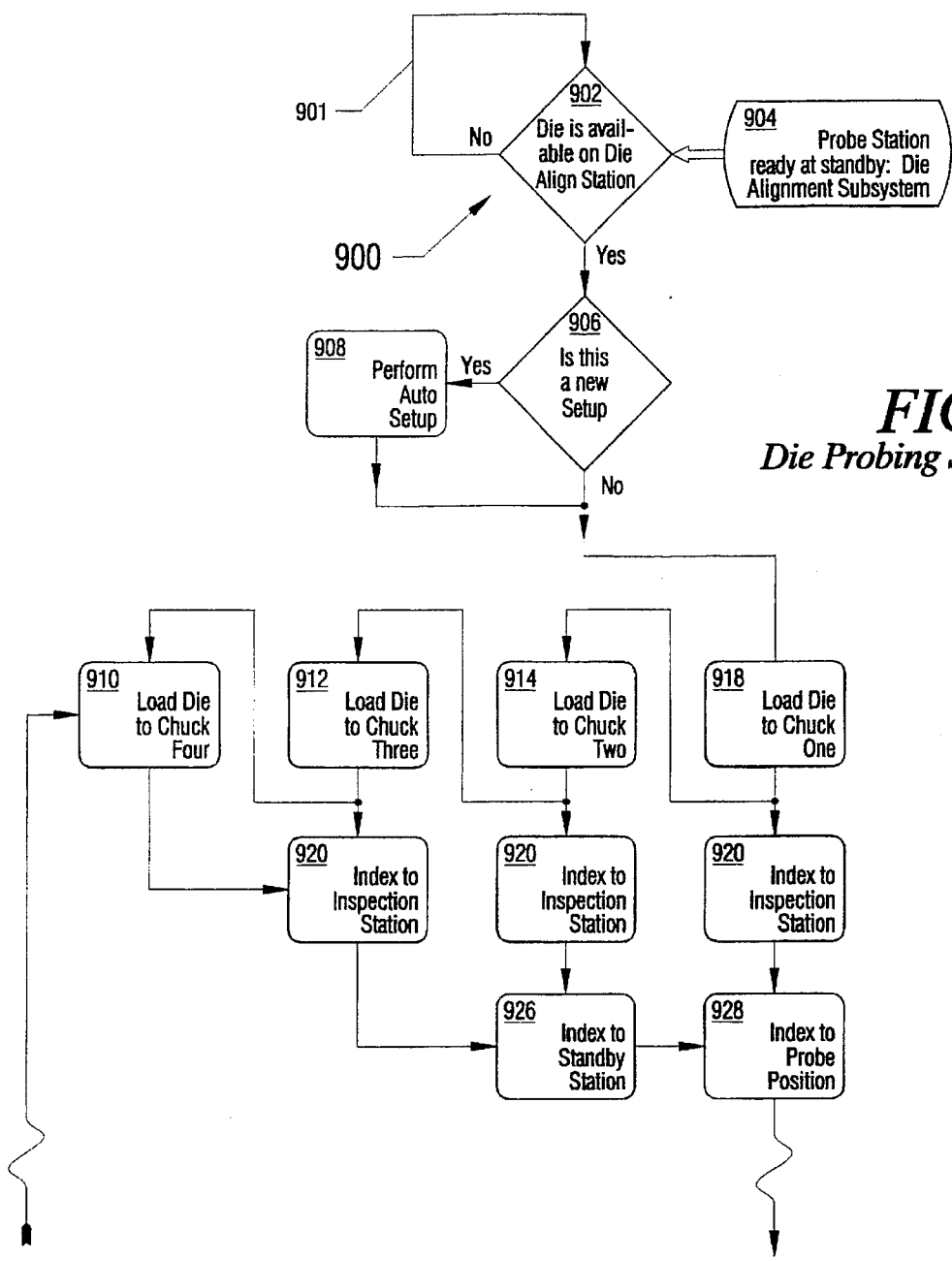
FIG. 13 is a simplified flow diagram for the die probing subsystem for the die sort apparatus of FIG. 8.
Figure 13B:
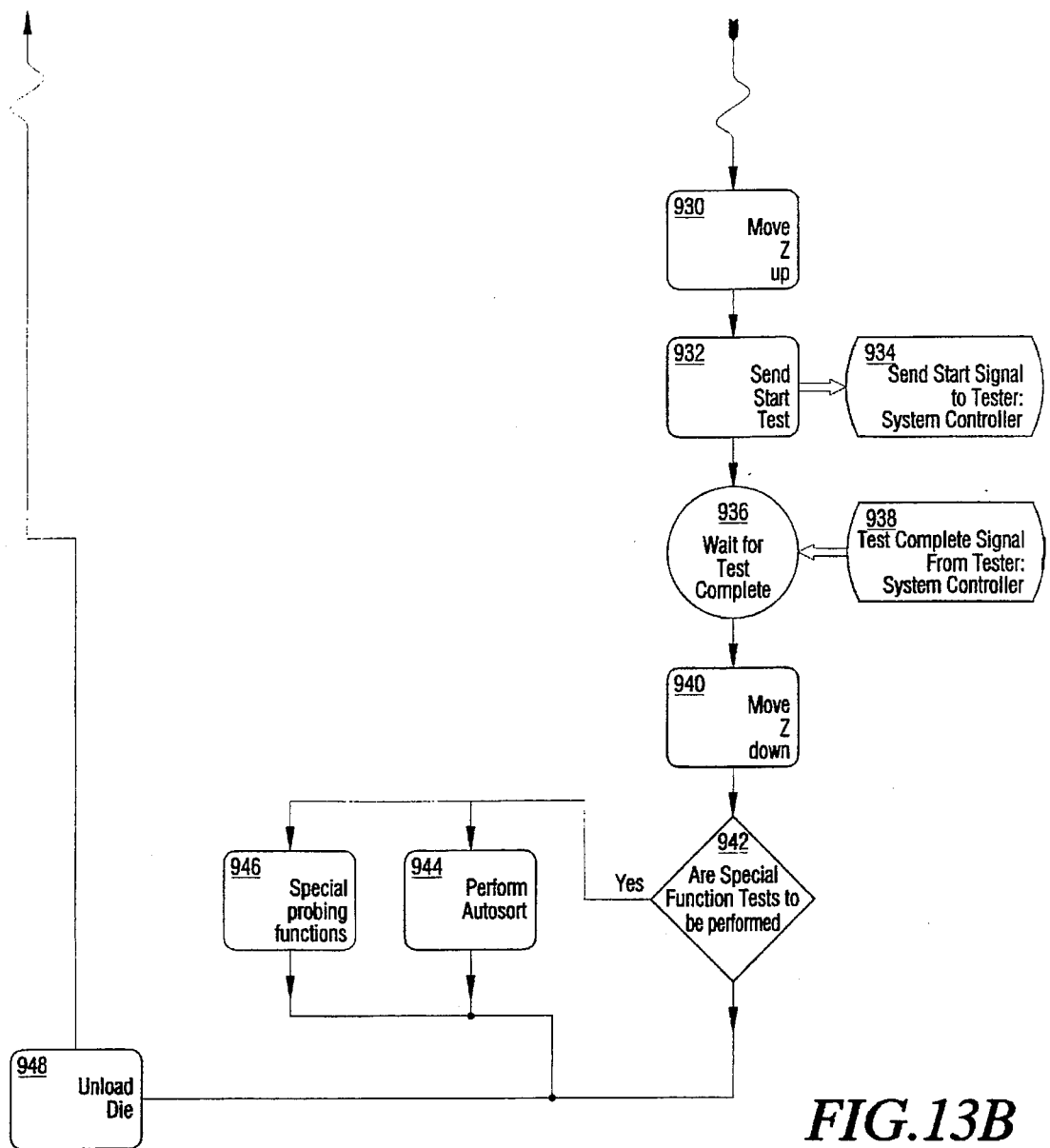

FIG. 13 is a simplified flow diagram for the die probing subsystem for the die sort apparatus of FIG. 8. The operation of the die probing subsystem (DPS) begins at for example function 902. The DPS looks for an aligned die on the DAS 902 and for an available DPS probe station to receive the die 904. When "ready" signals are sent by both the aligned die and DPS probe station, the DPS checks the set-up of the probe card and tester for operability 906. Otherwise, the DPS waits for the aligned die and DPS probe station ready signal 901.

A set-up 906 often accompanies the use of a different product type at the die sort apparatus. The set-up procedure includes various tests such as an auto set-up 908 procedure with use of for example the function devices of FIGS. 16, 17, and 18. Once the auto set-up procedure has been performed, and the tester and die sort apparatus meet the needs for the particular product type, the pick and place positions the die onto the chuck, typically located at the die placement location of the die probing subsystem.

The pick and place places the die on either chuck one 918, chuck two 914, chuck three 912, chuck four 910, or others depending upon the location of such chucks. For example, chuck one receives a die at the die placement location, and a circular linear motor of such chuck moves such chuck with die to other positions such as an inspection station 920. Chucks two, three, and four can also move from the placement location to the inspection station 920. Of course, since the inspection station in this example can only occupy one chuck, chucks two, three, and four move into the inspection station at different times. Of course, the exact movement of each chuck depends upon the particular application.

The inspection station typically relies upon a CCD type camera and a pattern recognition system to obtain a digitized representation of the die under inspection (DUI). The digitized representation of the die is matched to a digitized representation of a known good part. When the digitized representation of the DUI fails to compare accurately with the representation of the known good part, the DPS moves the die to an output chuck which transfers such die to the appropriate die bin and die output subsystem for disposal. Alternatively, the DPS may move the die to a probing position for test purposes. From the inspection station, chuck one moves to the probe station, but chucks two, three, and four move to a standby station, typically awaiting for the die at the probe station which is chuck one in this example.

The die and in particular the pads at the probe station come in contact with the probes of the probe card, typically by way of the z-mechanism. The z-mechanism indexes 930 the chuck assembly at the probe station such that the die pads contact the probes of the probe card. The DPS sends 932 a "start test" signal to the main system controller, the test begins, and the DPS waits 936 for the test to complete. Once complete, the main system controller sends a "test complete" signal to the DPS. The z-mechanism indexes the chuck assembly down 940 to separate the probes from the bond pads. Optionally, a special function test 942 may be performed. The special function test includes tests such as special probing functions 946, auto sort 944, and others. When no special function test is desired, the circular linear motor apparatus moves the chuck assembly from the probe station to the unload station, typically to be picked up by a pick and place. The DPS and in particular the chuck returns to pick up die at the die placement station. The die load process continues until no dies are available from the DAS alignment stations.

Die Binning and Die Output Subsystem

Figure 14A:
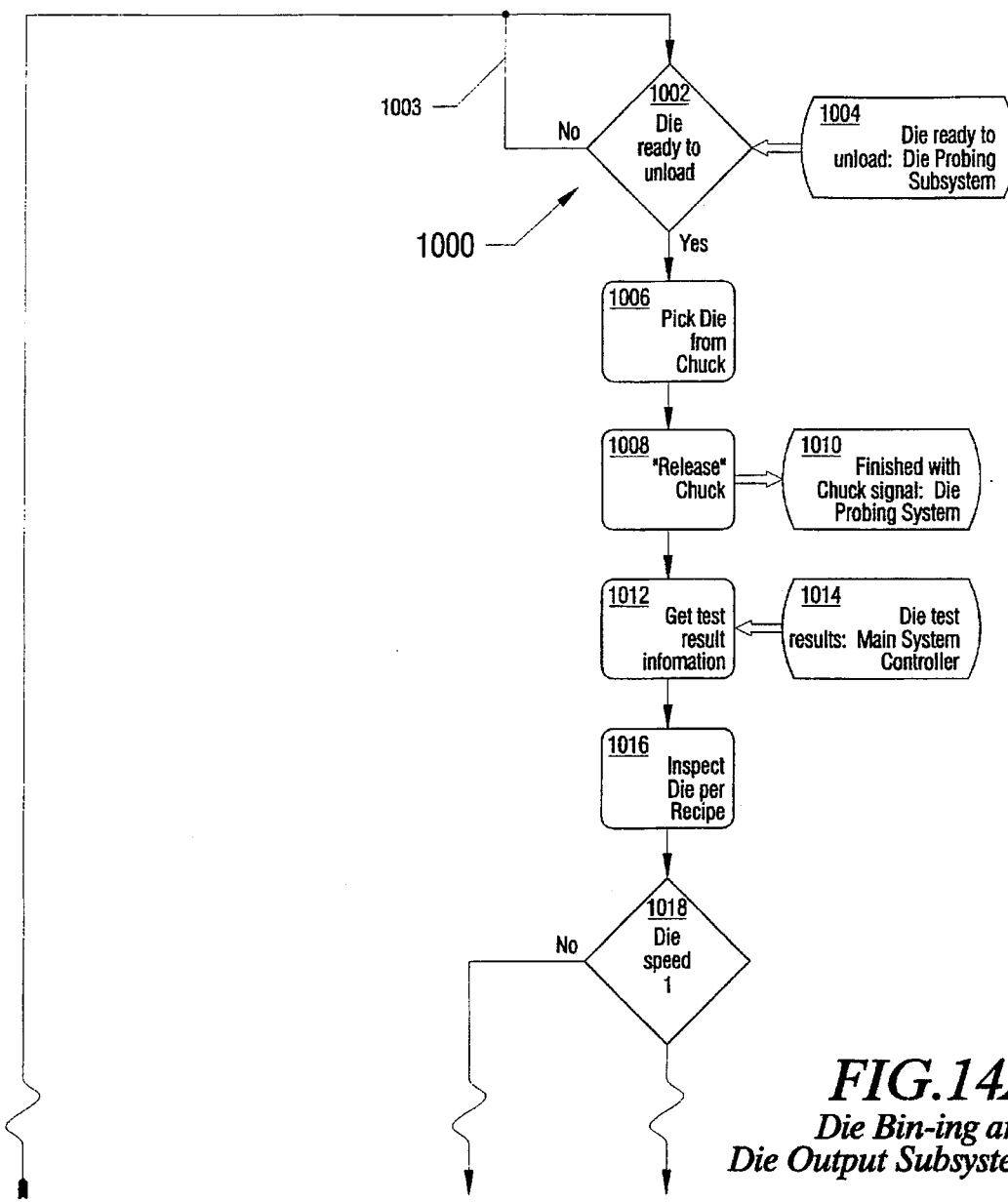
FIG. 14 is a simplified flow diagram for the die binning and die output subsystem for the die sort apparatus of FIG. 8.
Figure 14B:
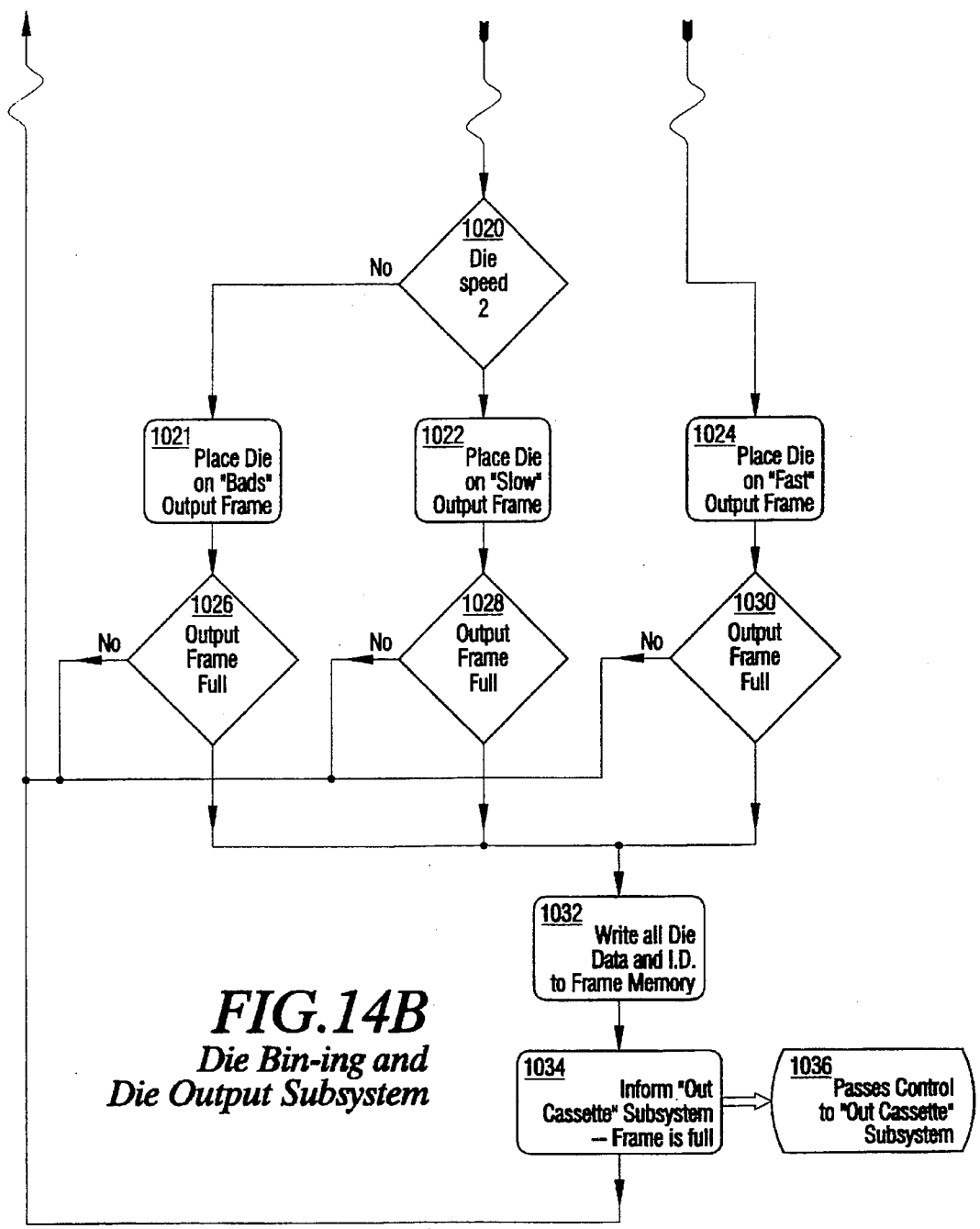

FIG. 14 is a simplified flow diagram for the die binning and die output subsystem for the die sort apparatus of FIG. 8. The operation for the die binning and die output subsystem 1000 (DBOS) begins for example at function 1002, the die ready to unload step. The DBOS receives a "die ready" signal from the DPS unit 1004, and the DBOS picks 1006 up the die from the chuck at the DPS unload site, typically with use of the pick and place. The pick and place then moves the die onto the continuous loop track, and the FAS sends a signal to the DPS 1010 to release the chuck at the unload site. Alternative, the DBOS waits 1003 for the "die ready" signal.

The DBOS receives test result 1012 information for the die from the main system controller, which sends such information 1014. By way of the continuous loop track and various pick and place mechanisms, each die is placed onto one of many output frames, each receiving a particular die category or bin.

Optionally, the DBOS inspects 1016 the die with use of the post test inspection apparatus. The post inspection apparatus uses a CCD type camera arrangement with use of pattern recognition and digitizing techniques to compare the die under post test (DUPT) to the recipe which was received from the main system controller. The recipe includes a digitized representation of a known good part for comparison.

By use of the die test result and post inspection result, the DBOS categorizes each die by either die speed 1 1018, die speed 2 1020, die reject, and others. The DBOS places the die speed 1 die, the die speed 2 die, and reject die onto the fast out frame, slow out frame, and bad die out frame, respectively. The DBOS checks the status of each frame, that is, whether the frame is full or not, and either begins the operation at function 1002 for a partially full or incomplete frame, or writes die data such as identification and test results 1032 into a frame memory for a full or completed frame. It should be noted that the frame memory corresponds to the memory means on the frame-type wafer handling means. For the full frame, the DBOS sends 1034 a "full output frame" signal to the output cassette subsystem, and passes control for the full frame to the output cassette subsystem 1036. The DBOS then resets the operation to function 1002.

Output Cassettes Subsystem

Figure 15A:
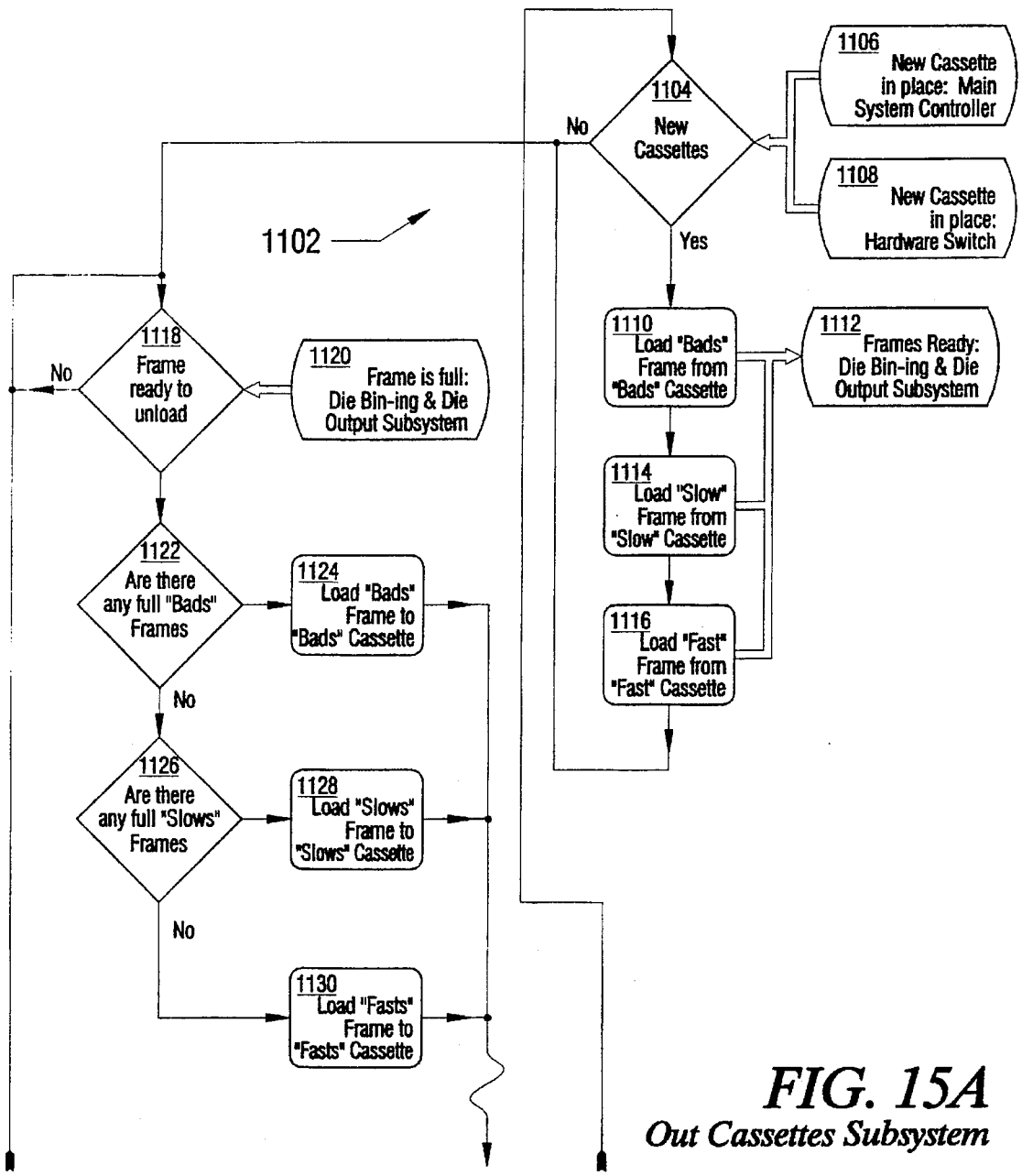
FIG. 15 is a simplified flow diagram for the output cassettes subsystem for the die sort apparatus of FIG. 8.
Figure 15B:
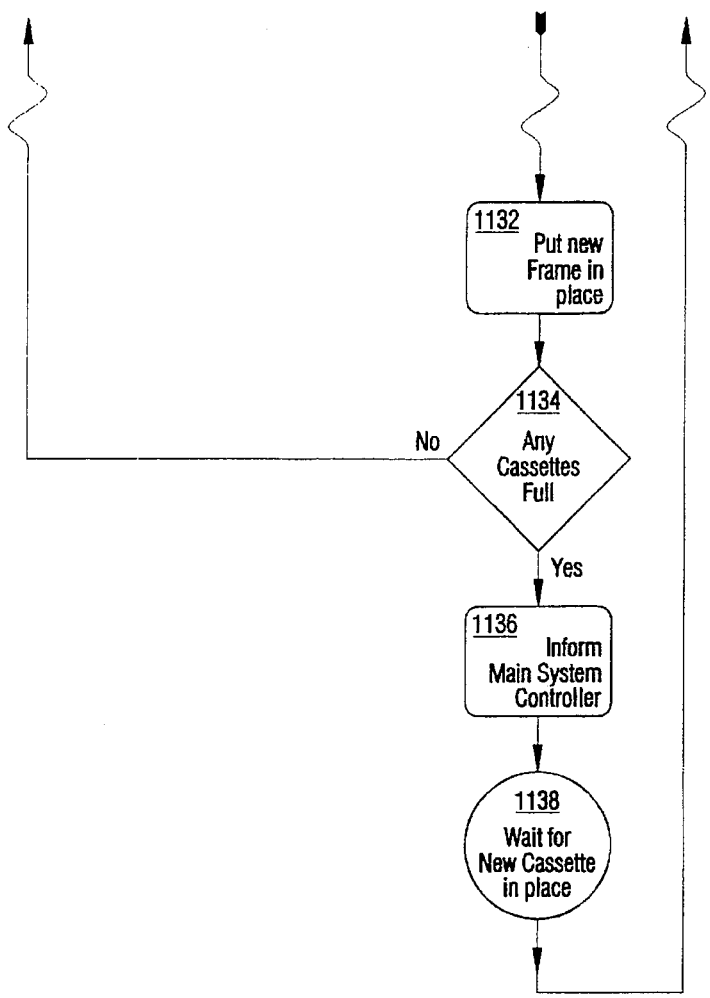

FIG. 15 is a simplified flow diagram for the output cassettes subsystem (OCS) 1100 for the die sort apparatus of FIG. 8. The output cassettes subsystem 1102 begins operation at for example function 1118, the frame ready to unload function. When no frames are available from the DBOS, the OCS waits for a full or completed frame. The DBOS sends a "output frame full" signal to the OCS 1120. The OCS looks for the full frame from either the bad die out frame 1126, slow out frame 1122, or defaults to the fast out frame, in that order. The frame handler removes the full bad die out frame from the DBOS, and places such frame into the bad die cassette. Alternatively, the frame handler removes the full slow die out frame, and places such frame into the slow die cassette. Alternatively, the frame handler removes the full fast die out frame, and places such frame into the fast die cassette. The frame handler places a new empty frame in place at the DBOS.

The OCS looks for any full cassettes 1134, and then continues operation at function 1118 if no full cassettes exist. Alternatively, when a cassette becomes full, the OCS informs the main system controller 1136, and waits for a new cassette 1138. When the OCS does not receive the new cassette, the OCS resumes operation at function 1118. Alternatively, the OCS receives a new cassette as verified by a "new cassette" signal from the main controller and hard wire cassette switch, typically a proximity switch, mechanical switch, photo-electric switch, optical switch, and others. The OCS then either loads an empty bad die out frame, slow die out frame, or fast die out frame onto the frame handler, depending upon the type of new cassette in position. The OCS then resumes operation at function 1118. Of course, this simplified flow diagram is shown only for illustrative purposes.

Although the foregoing invention has been described in some detail by way of illustration and example, for purposes of clarity of understanding, it will be obvious that certain changes and modifications may be practiced within the scope of the appended claims.

The above description is illustrative and not restrictive. Many variations of the invention will become apparent to those of skill in the art upon review of this disclosure. Merely by way of example the invention may used to test die in other applications such as packaged die testing, further modifications of die probing, and the like. The scope of the invention should, therefore, be determined not with reference to the above description, but instead should be determined with reference to the appended claims along with their full scope of equivalents.

What is claimed is:

1. A method of manufacture for a semiconductor integrated circuit comprising the steps of:
   providing a fabricated wafer comprising a plurality of semiconductor integrated circuits, said plurality of semiconductor integrated circuits being substantially untested;
   separating each of said semiconductor integrated circuits from said fabricated wafer; and
   probing each of said semiconductor integrated circuits.

2. The method of claim 1 further comprising the step of testing each of said semiconductor integrated circuits.

3. The method of claim 2 further comprising the step of assembling each of said semiconductor integrated circuits after said testing step.

4. The method of claim 1 further comprising the step of aligning each of said semiconductor integrated circuits to an interface means before said probing step.

5. The method of claim 4 wherein said interface means comprises a probe card comprising probes.

6. The method of claim 4 wherein said aligning step comprises a pre-aligning step and a fine alignment step of said semiconductor integrated circuit.

7. The method of claim 1 wherein said separating step comprises a sawing step.

8. The method of claim 2 further comprising a step of categorizing each of said tested semiconductor integrated circuits.

9. The method of claim 8 wherein said categorizing step separates each of said semiconductor integrated circuits into die binning group consisting essentially of a fast die, a slow die, and a reject die.

10. The method of claim 8 further comprising a step of placing each of said categorized semiconductor integrated circuits onto separate frames.

11. A method of manufacture for a semiconductor integrated circuit comprising the step of testing a semiconductor integrated circuit by use of a die sorter.

12. The method of claim 11 wherein said testing step comprises a step of probing said semiconductor integrated circuit, said semiconductor integrated circuit being separated from a semiconductor wafer.

13. The method of claim 11 further comprising a step of:
   separating said semiconductor integrated circuit from a semiconductor wafer; and
   providing said semiconductor integrated circuit to said die sorter.

14. The method of claim 11 further comprising a step of assembling and semiconductor integrated circuit.

15. A method of identifying integrated circuits on a fabricated semiconductor wafer comprising the steps of:
   providing a fabricated wafer comprising a plurality of semiconductor integrated circuits onto a wafer saw, said plurality of semiconductor integrated circuits being untested; and
   entering information comprising an identification characteristic of said fabricated wafer into a memory coupled to said wafer saw.

16. The method of claim 15 further comprising a step of retrieving said information of said fabricated wafer from a computer network before said entering step.

17. The method of claim 15 wherein said memory comprises a memory of said wafer saw.

18. The method of claim 15 wherein said memory comprises a touch boat memory device.

19. The method of claim 15 wherein said retrieving step occurs through manual data entry and network capability.

20. The method of claim 15 wherein said information comprises wafer identification.

21. The method of claim 20 wherein said wafer identification can be selected from a group of information consisting essentially from a planarization characteristic, a device size, test results, and a product name.

22. The method of claim 15 further comprising a step of entering said information of said fabricated wafer from a group of interface means consisting essentially of a keyboard, a bar-code, and keyboard/bar-code combination.

23. The method of claim 15 further comprising a step of:
   sawing said fabricated wafer to separate each of said semiconductor integrated circuits;
   recognizing a wafer pattern from said semiconductor integrated circuit;
   storing said wafer pattern on a memory means; and
   retrieving said wafer pattern at a die prober apparatus.

24. The method of claim 23 further comprising a step of using said wafer pattern to align said semiconductor integrated circuit.

25. A method of set-up for a probe card comprising the steps of:

providing a pin array carrier assembly comprising a pin array top surface at a test site;

adjusting said pin array carrier assembly to contact said pin array top surface with probes of a probe card;

sending first signals to each of said probes;

receiving second signals through said pin array top surface;

decoding said second signals;

identifying an X-coordinate, Y-coordinate, and THETA-coordinate of each of said probes through said decoded second signals.

26. The method of claim 25 wherein said pin array comprising a plurality of pins.

27. The method of claim 25 further comprising a step of adjusting said THETA-coordinate of said probe card by reference to a known standard.

28. A method of manufacture for a semiconductor integrated circuit comprising the steps of:

providing a fabricated wafer comprising a plurality of semiconductor integrated circuits, said plurality of semiconductor integrated circuits being untested;

separating each of said semiconductor integrated circuits from said fabricated wafer; and probing each of said semiconductor integrated circuits, said semiconductor integrated circuits being unpackaged.

29. A method of identifying integrated circuits on a fabricated semiconductor wafer comprising the steps of:

providing a fabricated wafer comprising a plurality of semiconductor integrated circuits onto a wafer saw, said fabricated wafer being substantially free from electrical tests; and entering information comprising an identification characteristic of said fabricated wafer into a memory coupled to said wafer saw.

* * * * *